(12) United States Patent  (10) Patent No.: US 6,774,831 B2
Saito  (45) Date of Patent: Aug. 10, 2004

(54) ANALOG SWITCH CIRCUIT

(75) Inventor: Yasuyuki Saito, Higashiyamoto (JP)

(73) Assignees: Renesas Technology Corp., Tokyo (JP); Hitachi Hokkai Semiconductor, Ltd., Hokkaido (JP)

( * ) Notice: Subject to any disclaimer, the term of this patent is extended or adjusted under 35 U.S.C. 154(b) by 0 days.

(21) Appl. No.: 10/419,923

(22) Filed: Apr. 22, 2003

(65) Prior Publication Data

US 2003/0201818 A1 Oct. 30, 2003

Related U.S. Application Data

(63) Continuation of application No. 10/283,110, filed on Oct. 30, 2002, now Pat. No. 6,577,263, which is a continuation of application No. 09/960,925, filed on Sep. 25, 2001, now Pat. No. 6,509,860.

(30) Foreign Application Priority Data

Sep. 28, 2000 (JP) .................................. 2000-296576

(51) Int. Cl.$^7$ ................................................ H03M 1/00
(52) U.S. Cl. ........................ 341/141; 341/122; 327/403
(58) Field of Search ................................ 341/141, 122, 341/155; 327/403, 404, 405

Primary Examiner—Peguy JeanPierre
(74) Attorney, Agent, or Firm—Reed Smith L.L.P.; Stanley P. Fischer, Esq.; Juan Carlos A. Marquez, Esq.

(57) ABSTRACT

An analog switch and an analog multiplexer are realized by which electron charges which have been stored in a stray capacitance provided on the output side thereof before a switch is conducted do not give an adverse influence to a level of such an analog input voltage which is subsequently entered after the switch has been switched. An analog switch circuit is arranged by insulating gate type transistors and a voltage follower which is parallel-connected to these insulating type transistors. When the analog switch circuit is turned ON, the voltage follower is firstly brought into an active state, and thereafter, these insulating gate type transistors are brought into conductive conditions.

13 Claims, 17 Drawing Sheets

ANALOG SWITCH CIRCUIT

This application is a continuation application of U.S. application Ser. No. 10/283,110 filed on Oct. 30, 2002, now U.S. Pat. No. 6,877,263 which is a continuation of U.S. application Ser. No. 09/960,925 filed on Sep. 25, 2001, now U.S. Pat. No. 6,809,860

BACKGROUND OF THE INVENTION

The present invention is related to an analog switch, and a sample-and-hold circuit for an analog input voltage. More specifically, the present invention is directed to such a technique capable of reducing an adverse influence caused by such a voltage which has already been inputted into an analog multiplexer. For instance, the present invention is pertinent to such an effective technique which is utilized in an A/D converting circuit, and also a single-chip microprocessor computer having the A/D converting cirvcuit therein.

In an A/D (analog-to-digital) converting circuit, and a semiconductor integrated circuit containing this A/D converting circuit, an analog switch, and a sample-and-hold circuit are employed. The analog switch is used so as to conduct an analog input voltage from an external source, and this analog input voltage should be A/D-converted. The sample-and-hold circuit holds the analog input voltage while being A/D-converted. Also, in the case that there are plural analog signals derived from a plurality of sensors as realized in a control system for an automobile, when each of these plural analog signals is A/D-converted into a digital signal by using a respective one of the individual A/D converting circuits, a total number of these A/D converting circuits becomes large, so that cost of the automobile control system would be increased. As a consequence, such an automobile control system may be sometimes arranged in such a manner that a plurality of analog input voltages are A/D-converted in a time divisional manner by employing a single A/D converting circuit.

FIG. 20 represents such a time-divisional type A/D converting system. This system is arranged as follows: That is, in this A/D converting system, a plurality of analog input voltages Vin1, Vin2, - - - , Vinn are selected by a multiplexer MPX one by one, and then, the selected analog input voltages are acquired by a sample-and-hold circuit SH. Thus, a plurality of analog input voltages are A/D-converted in the time divisional manner by using a single A/D converting circuit ADC.

SUMMARY OF THE INVENTION

In the A/D converting system as indicated in FIG. 20, analog switches SWc1 to SWcn which constitute the multiplexer MPX, and a sampling switch SWs of the sample-and-hold circuit SH are constituted by employing MOSFETs. On the other hand, in the A/D converting system of FIG. 20, a stray capacitance Ca is produced at a connection node N0 between the analog switches SWc1 to SWcn of the respective channels which constitute the multiplexer MPX, and the sampling switch SWs which constitutes the sample-and-hold circuit SH.

The production of the above-described stray capacitance Ca is caused by a junction capacitance and a wiring capacitance between a source (drain) and a main body (well) of an MOSFET. When the Inventors of the present invention tried to calculate such a stray capacitance of a circuit having 8 channels, this stray capacitance was approximately 30 pF (picofarad). Also, another stray capacitance Ca is produced at an input terminal of an A/D converting circuit 30 of FIG. 20. Furthermore, as a capacitance value of a sampling capacitor Cs which constitutes this sample-and-hold circuit SH, such sampling capacitors having capacitance values of, for example, approximately 5 to 6 pF are used.

On the other hand, in order to improve the response characteristic of the sample-and-hold circuit SH, impedances (ON-resistances) of the analog switches SWc1 to SWcn, and also an impedance (ON-resistance) of the sampling switch SWs are preferably made low. For instance, in the case that sampling time is selected to be on the order of 3 $\mu$s (microseconds), an impedance of such a sample-and-hold circuit may be preferably selected to be lower than, or equal to 1 k$\Omega$ (killoohms).

However, the following risk problem can be revealed. That is, when the channels are switched by the multiplexer MPX, if the impedances of the analog switches SWc1 to SWcn are low and further the stray capacitance Ca is produced at the connection node N0 between the analog switches SWc1 to SWcn and the sampling switch SWs, the electron charge which has been stored in this stray capacitance Ca before the channels are switched may give an adverse influence to a level of a next analog input voltage which is inputted via such an analog switch which is turned ON after the channels are switched by the multiplexer MPX. As a result, an error of the analog input voltage to be sampled would be increased.

To avoid this problem, in such a control system as shown in FIG. 20 in which while the channels are switched by the multiplexer MPX, the A/D converting operation is carried out in the time divisional manner, it is preferable to connect externally-connectable capacitors Ci1 to Cin each having capacitances of approximately 0.1 $\mu$F to the respective analog input terminals AIN1 to AINn. The reason why the error can be reduced is given as follows. That is, when such externally-connectable capacitances Ci1 to Cin are connected to these analog input terminals AIN1 to AINn, electron charges are redistributed via such an analog switch which is turned ON between the stray capacitance Ca and any one of these externally-connectable capacitors Ci1 to Cin, which may reduce the error of the analog input voltage to be sampled.

FIG. 21 graphically shows a relationship between an internal impedance Rin of an analog signal source and an error $\delta$ (LSB) of an analog input voltage Vin to be sampled, assuming now that the capacitance values of the externally-connectable capacitors Ci1 to Cin which are connected to the analog input terminals AIN1 to AINn are constant. In this case, it is so assumed that the error $\delta$ (LSB) may be expressed by the following formula (1) under such a condition that resolution of the A/D converting circuit is selected to be 10 bits, a reference voltage is selected to be Vref, and also a voltage which is actually acquired into the sampling capacitor Cs is selected to be "Vs":

$$\delta(LSB)=(Vin-Vs)/(Vref/1024) \quad (1)$$

In this drawing of FIG. 21, a solid line "a" indicates such an error plotted in the case that the capacitance value of the externally-connectable capacitor Ci is equal to 0.1 $\mu$F. A broken line "b" indicates such an error plotted in the case that the capacitance value of the externally-connectable capacitor Ci is equal to 0.07 $\mu$F. Also, a dotted line "c" indicates such an error plotted in the case that the capacitance value of the externally-connectable capacitor Ci is equal to 0.05 $\mu$F.

It should be noted that the relationship of FIG. 21 is obtained under the below-mentioned condition: That is, a range of an operation voltage is selected to be zero V to +0.5 V and −0.5 V; sampling time of an analog input voltage is selected to be 3.2 μS; an equivalent capacitance value (Ca+Cs+Cd) defined from an analog input terminal AIN up to a sample-and-hold circuit is selected to be approximately 50 pF; and further, both an equivalent impedance of an analog switch SWc of a multiplexer and another equivalent impedance of a sampling switch SWs own such a characteristic represented in FIG. 22. In FIG. 22, a curve indicated as a symbol "WORST" denotes an impedance of such an element having the largest fluctuation. Also, a curve indicated as a symbol "TYP" denotes an impedance of a typical element.

The following fact can be seen from FIG. 21. That is, the larger the capacitance values of the externally-connectable capacitors Ci1 to Cin of the analog input terminals AIN1 to AINn become, the smaller the error is decreased. However, when the capacitance values of the externally-connectable capacitors Ci1 to Cin are increased in an automobile control system, the following fact could be revealed. That is, there is a certain possibility that precision of the A/D converting operation is lowered. Under such a circumstance, the Inventors of the present invention has considered this reason of lowering of the A/D converting precision. As a result, the following fact can be revealed:

In such a system which is operated under the worst environment where external noise is increased similar to a control system of an automobile, since an S/N (signal-to-noise) ratio of a sensor functioning as an analog signal source is improved, a series resistor (resistance values of several tens to several hundreds KΩ) may be arranged between an analog input terminal of an A/D converter and a signal of the sensor so as to constitute a filter circuit. Alternatively, such a sensor circuit having several tens to several hundreds KΩ as an overall impedance of an analog signal source may be employed. As a consequence, the Inventors of the present invention could predict that a response characteristic of an input voltage in this control system may cause the above-explained reason, and firstly, have considered the response characteristic of this control system with respect to the input voltage. Concretely speaking, while the Inventors of the present invention considered that a voltage VA(i) which is entered into an analog input terminal AIN(i) is changed in an exponential manner as represented in FIG. 23, such a formula capable of expressing a temporal change of this inputted analog voltage was obtained. This formula is given as follows:

$$VA(i)=Vin(T-1)+\Delta V(1-e(-t/(Ci \cdot Rin))) \quad (2)$$

In this formula (2), symbol "Vin(T−1)" shows a voltage appeared before the analog input voltage VA(i) is changed.

Next, under such a condition that the error Ω(LSB) of the analog input voltage Vin is equal to 0.1, the reference voltage Vref of the A/D converting circuit is equal to 5.0 V, and also the capacitance value of the externally-connectable capacitor Ci is equal to 0.1 μF, such a delay time was calculated while the internal impedance value Rin of the signal source was changed and also the magnitude of the changed voltage "ΔV" was changed. This delay time is defined by that the input voltage Vin is reached to 0.1(LSB) lower than a final voltage, namely is reached up to 0.5 mV. The calculation result of this delay time is graphically represented in FIG. 24. As apparent from FIG. 24, the following fact can be revealed. That is, the larger the internal impedance Rin of the signal source is increased and also the higher the changed voltage "ΔV" becomes, the longer the delay time is increased.

Also, as apparent from the above-explained formula (1), since a change in the input voltages Vin will depend upon such a time constant (CR) defined between the internal impedance Rin and the externally-connected capacitor Ci of the analog input terminal, the larger the capacitance value of this externally-connectable capacitor Ci is increased, the longer the delay time is prolonged (similar to the internal impedance Rin). For example, in FIG. 24, a broken line "C" which represents a delay time-to-changed voltage characteristic in the case that the internal impedance Rin is equal to 5 kΩ may become equal to another broken line "B" which indicates a delay time-to-changed voltage characteristic in such a case that the internal impedance Rin is equal to 10 kΩ when the capacitance value of the externally-connectable capacitor Ci becomes 0.2 μF. This first-mentioned broken line "C" may become equal to a further broken line "A" which represents a delay time-to-changed voltage characteristic in the case that the internal impedance Rin is equal to 20 kΩ when the capacitance value of the externally-connectable capacitor Ci becomes 0.4 μF.

On the other hand, even in a control system used under such an environment that a large number of external noise is present (similar in an automobile control system), it is practically difficult that internal impedances of all of sensors functioning as an analog signal source are reduced. In other words, in such an automobile control system, such a sensor whose internal impedance is high must be necessarily employed. Also, because of a distance relationship between a setting position of a sensor and a setting position of an A/D converter, a series resistor functioning as an external-noise-problem solution is provided in front of an analog input terminal, so that an impedance of a signal source is increased. However, as explained above, if the capacitance value of the externally-connectable capacitor Ci is increased, then delay time is prolonged. As a result, this capacitance value of the externally-connectable capacitor Ci cannot be excessively increased. As a consequence, in such a control system, the capacitance value of the externally-connectable capacitor Ci must be made small in the case that a sampling period should be prolonged so as to secure A/D converting precision, or conversely in such a case that the sampling period is shortened so as to secure a favorable response characteristic to some extent. Accordingly, there is such a problem that the A/D converting precision would be sacrificed.

An object of the present invention is therefore to provide both an analog switch and an analog multiplexer, by which an electron charge which has been stored in a stray capacitance before a switch is switched does not give an adverse influence to a level of a subsequent analog input voltage which is entered thereinto after the switch is switched.

Another object of the present invention is to provide such an A/D converting circuit capable of A/D-converting an analog input voltage in high precision.

A further object of the present invention is to provide such an A/D converting circuit capable of performing a high-precision A/D converting operation, while a high response speed thereof can be realized.

A still further object of the present invention is to provide such an A/D converting circuit capable of performing a high-precision A/D converting operation without lowering an S/N ratio thereof.

Typical inventive ideas selected from inventive ideas disclosed in the present invention will be briefly described as follows:

An analog switch circuit is constituted by a transfer gate made up of insulating gate type transistors, and a voltage follower connected in parallel to the transistors, and the analog switch circuit is arranged in such a manner that after the voltage follower is brought into an active state, the transistors are conducted.

In accordance with the above-explained means, it is possible to avoid such a condition that an adverse influence caused by a potential appeared on the output side is transferred via the analog switch brought into the ON state to the output side. In other words, electric charges which have been stored in a stray capacitance provided on the output side thereof before a switch is switched do not give an adverse influence to a level of such an analog input voltage which is subsequently entered after the switch has been switched.

Also, preferably, the above-described transfer gate is made as a CMOS transfer gate constituted by both a p-channel MOSFET and an n-channel MOSFET, which are connected in parallel to each other between an analog input terminal and an analog output terminal. Since the CMOS transfer gate is employed, not only a signal having a high potential, but also a signal having a low potential can be transferred without lowering a signal level.

Furthermore, the above-described insulating gate type transistor is preferably constituted by two transistors, the channels of which are connected in a series connection mode. Also, these two transistors are formed on different well regions which are formed on a semiconductor substrate. Since the analog switch circuit is constituted by the two transistors connected in the series connection mode, it is possible to avoid such an operation that a change in analog input signals is transferred to the output terminal side via a stray capacitance produced between sources and drains of these transistors. Also, since the two transistors connected in the series connection mode are formed on the different well regions, the following operation can be prevented. That is, a current is captured from the output terminal side by minority carriers which are produced in well regions in such a case that a negative voltage is applied to the input terminal, so that the potential is changed, which can be avoided by this analog switch circuit.

A multiplexer circuit, according to the present invention, is such that a plurality of analog switch circuits are constituted by a plurality of transfer gates each made up of an insulating gate type transistor, and voltage followers connected in parallel to channels of these transistors; and one terminal of these analog switch circuits are connected to a plurality of analog input terminals, whereas other terminals of these analog switch circuits are connected to a common output terminal. When any one of these analog switch circuits is selectively turned ON, the voltage follower of this relevant switch circuit is first brought into an active state, and thereafter, the insulating type transistor is set to the conductive state.

In accordance with the above-described means, it is possible to avoid such a phenomenon that an adverse influence caused by a potential appeared on the output side via the analog switch which is brought into the ON state is transferred to the side of the input terminal. Also, electric charges which have been stored in a stray capacitance provided on the output side thereof before the multiplexer circuit is switched do not give an adverse influence to a level of such an analog input voltage which is subsequently entered after the multiplexer circuit has been switched.

Also in this multiplexer circuit, the above-explained transfer gate may be preferably made as a CMOS transfer gate constituted by both a p-channel MOSFET and an n-channel MOSFET, which are connected in parallel to each other between the analog input terminal and the analog output terminal. Furthermore, the above-described insulating gate type transistor is preferably constituted by two transistors, the channels of which are connected in a series connection mode. Also, these two transistors are formed on different well regions which are formed on a semiconductor substrate.

Also, an A/D converting circuit, according to the present invention, is featured by employing a sample-and-hold circuit which is constituted by an analog switch circuit and a sample-and-hold circuit made up of a sampling capacitor. This analog switch circuit is arranged by an insulating gate type transistor, and a voltage follower which is connected in parallel to a channel of this insulating gate type transistor. The above-explained sampling capacitor is connected to an output terminal of the voltage follower circuit.

In accordance with the above-described means, it is possible to avoid such a phenomenon that an adverse influence caused by a potential appeared on the output side via the analog switch circuit which is brought into the ON state is transferred to the side of the input terminal. Also, the analog input signal can be sampled in high precision. As a result, the high-precision A/D converting operation can be carried out. Further, even when a capacitance value of an externally-connectable capacitor is decreased which is connected to the analog input terminal, the higher A/D converting precision can be achieved. Therefore, even when such an analog signal source having a high internal impedance is employed, namely even when such an analog signal source capable of withstanding noise aspects is used, propagation delay time of an input signal can be shortened. As a consequence, in such a system in which a plurality of analog signals are A/D-converted by a single A/D converting circuit in the time divisional manner, while using the multiplexer, the sampling period can be shortened without sacrificing the A/D conversion precision, and also, the A/D converting operation with the better response characteristic can be carried out.

BRIEF DESCRIPTION OF THE DRAWINGS

The above-described objects and other objects, and novel features of the present invention will become apparent from descriptions of the present specification and the accompanying drawings, in which.

Figure 9:
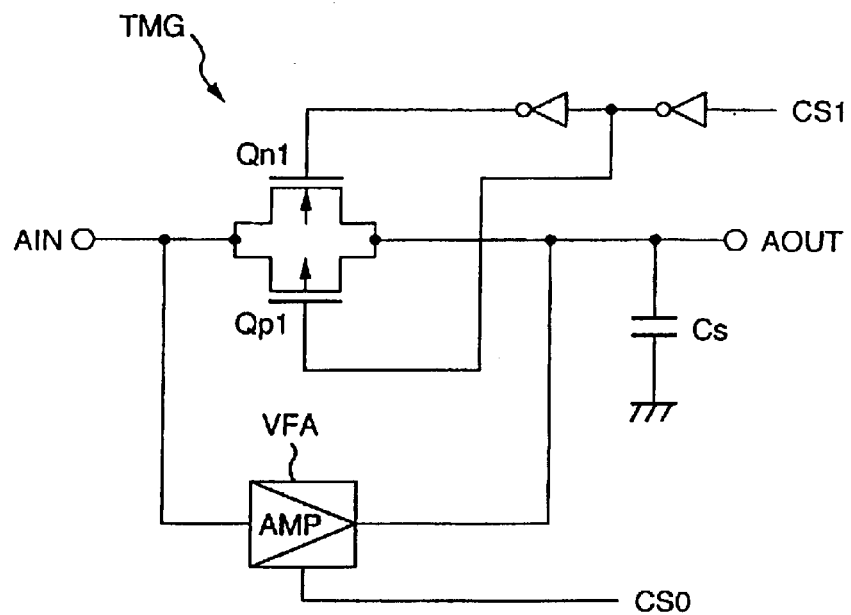
Figure 10:
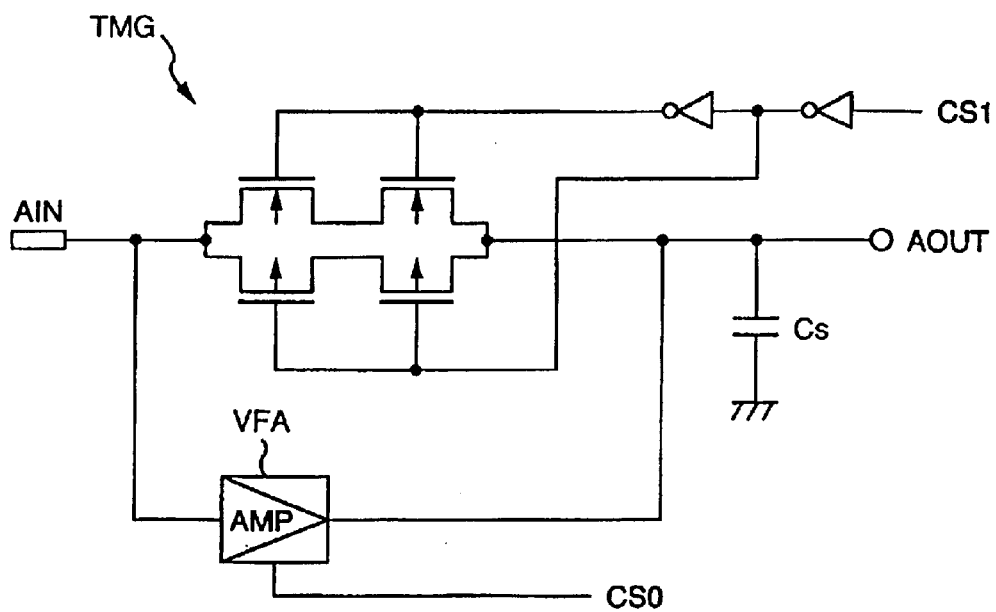
Figure 11:
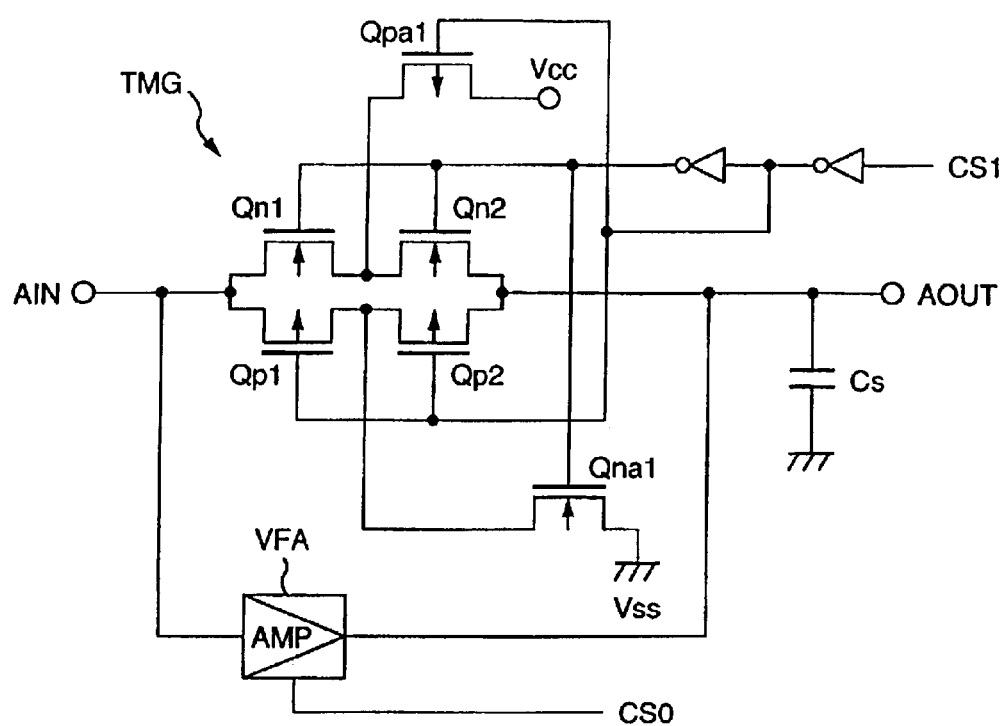
Figure 12:
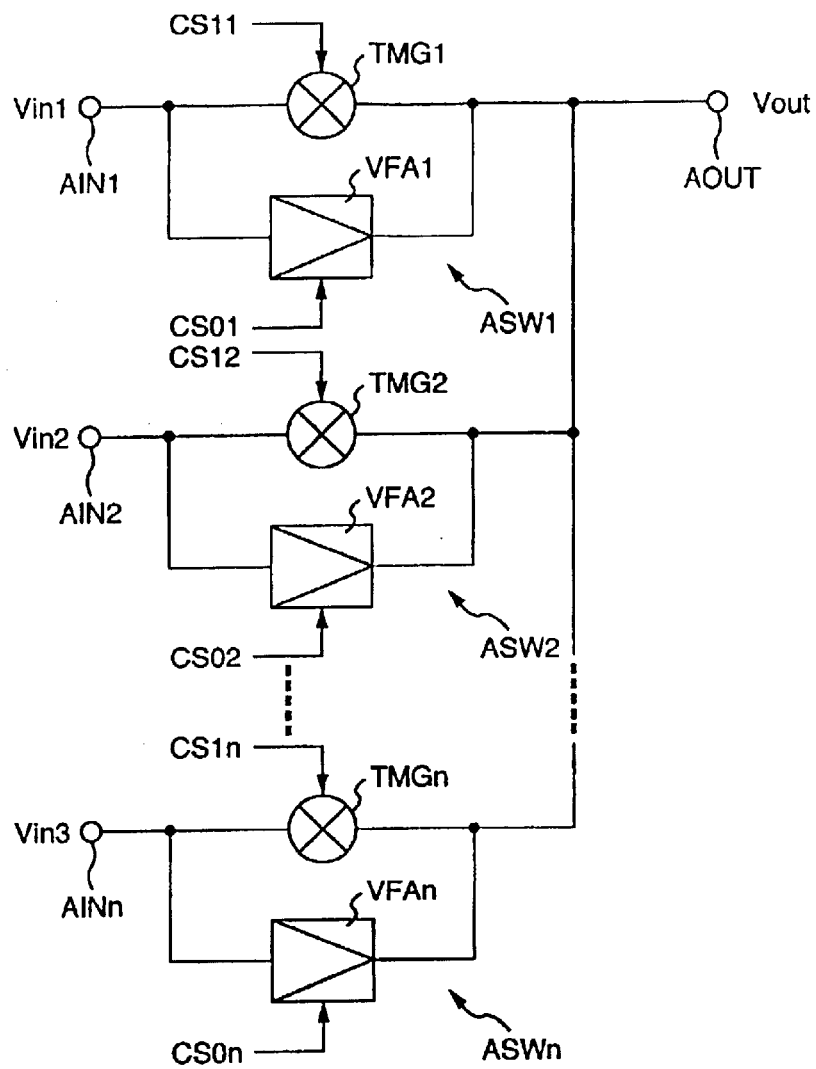
Figure 13:
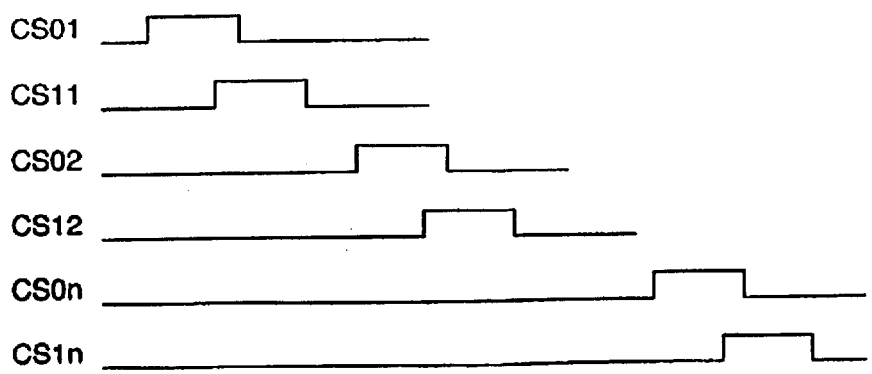
Figure 14:
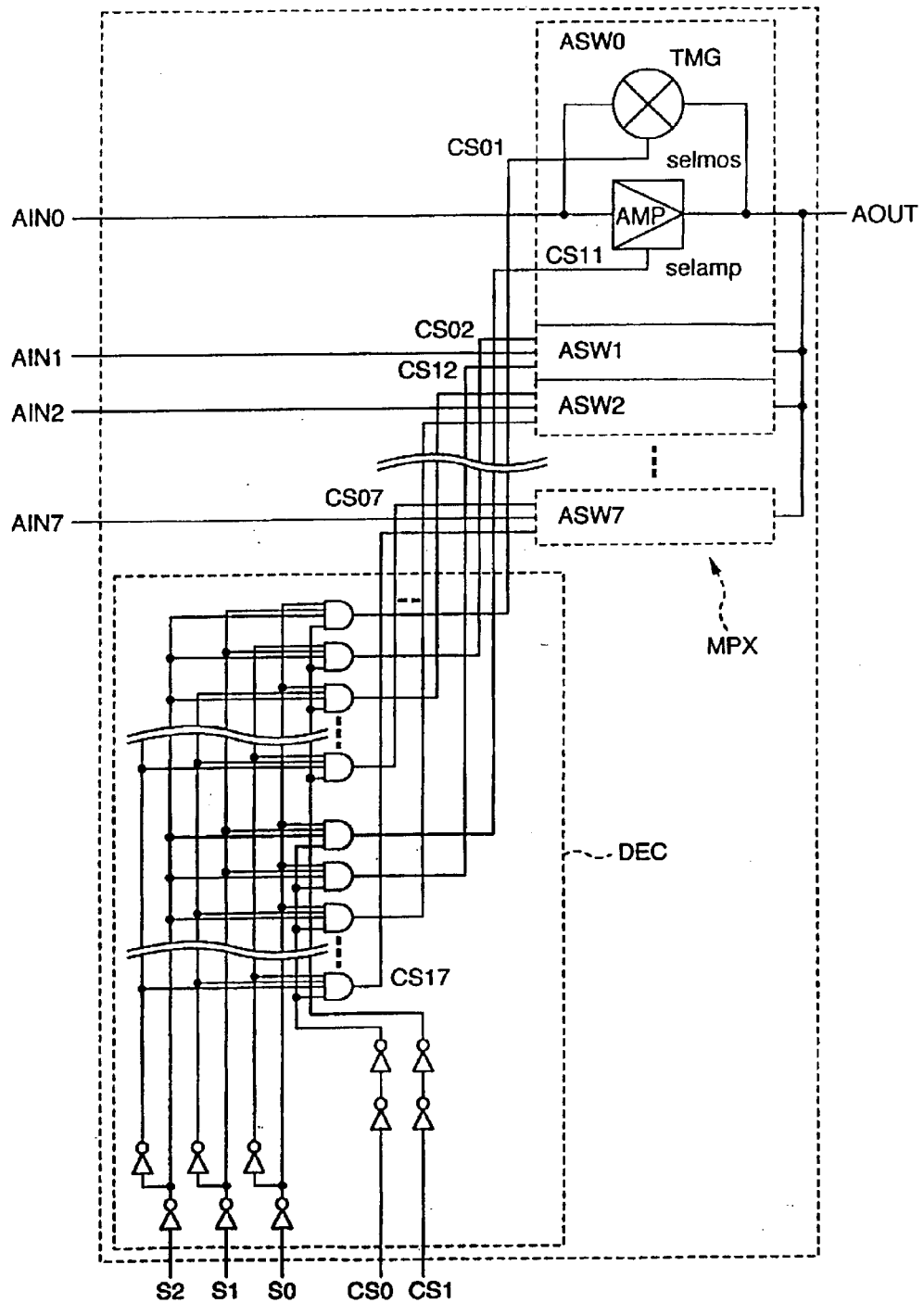
Figure 15:
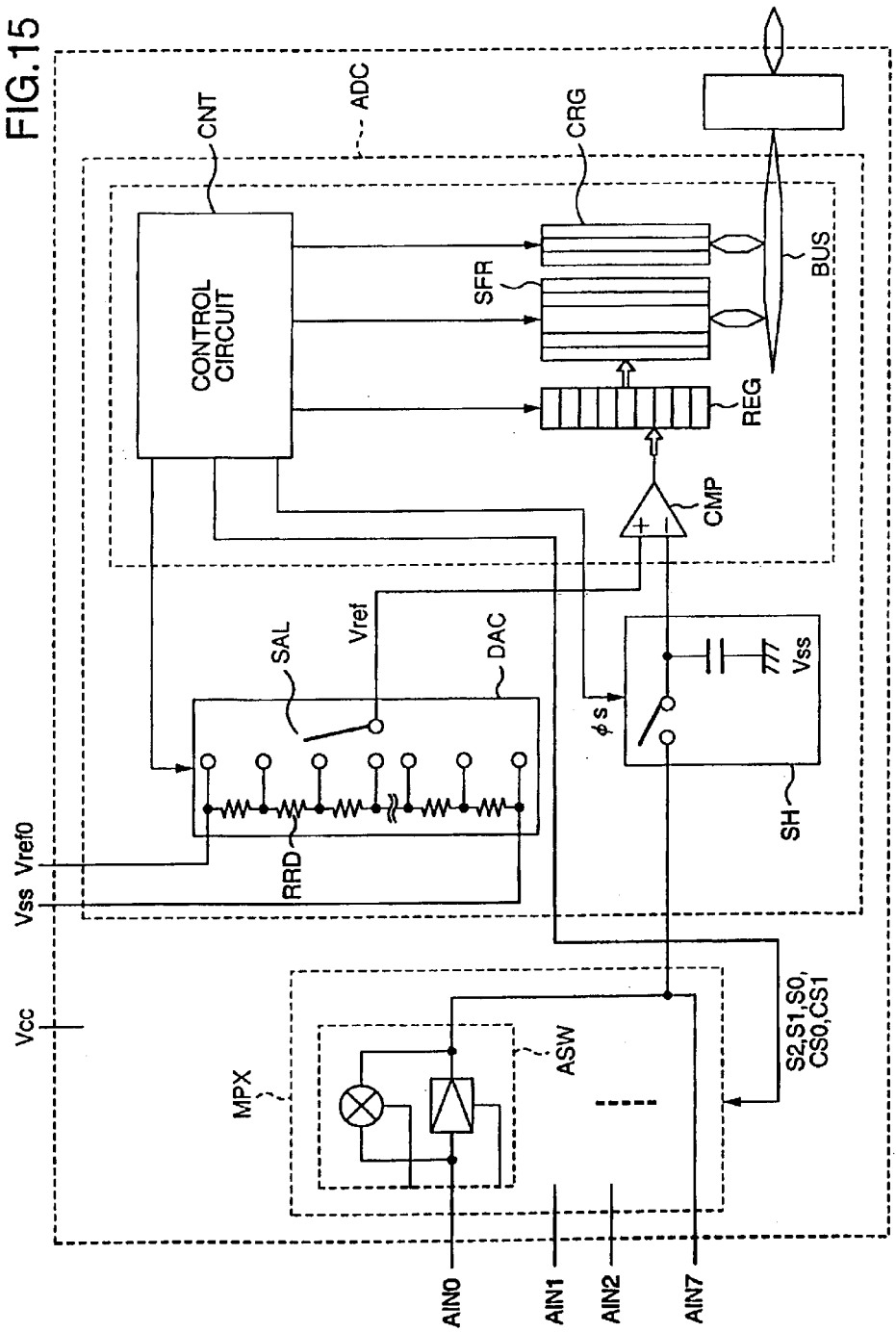
Figure 16:
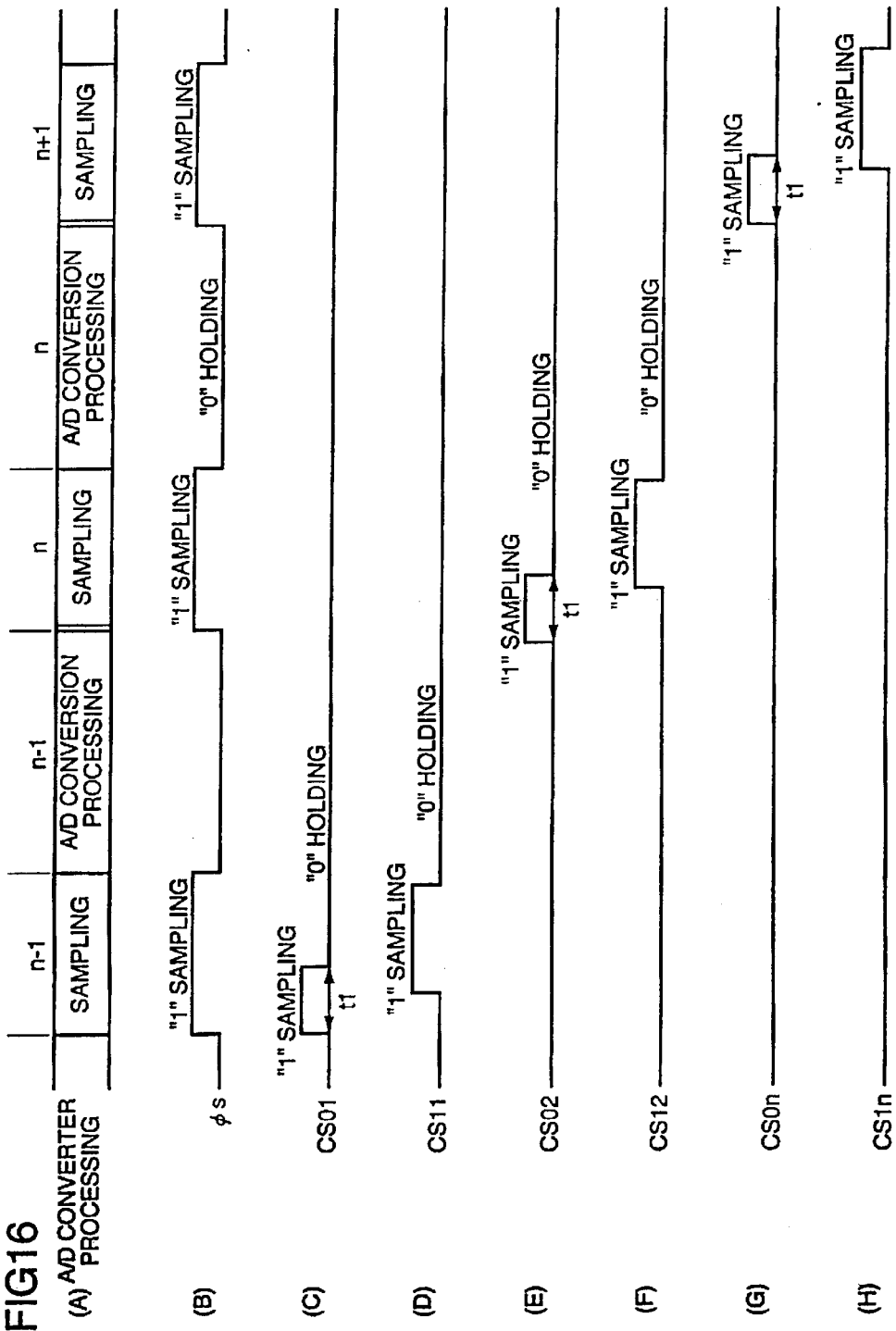
Figure 17:
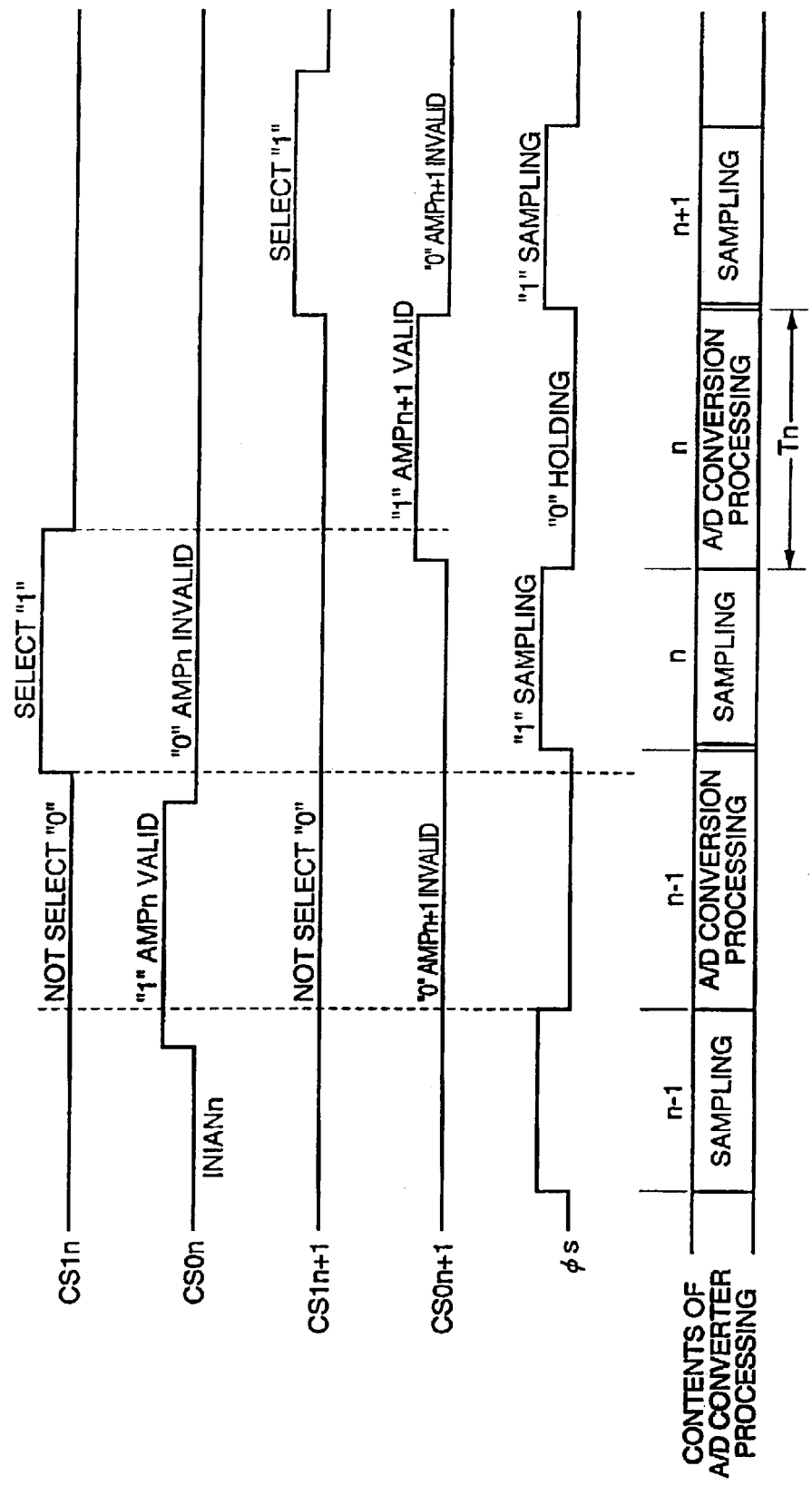
Figure 18:
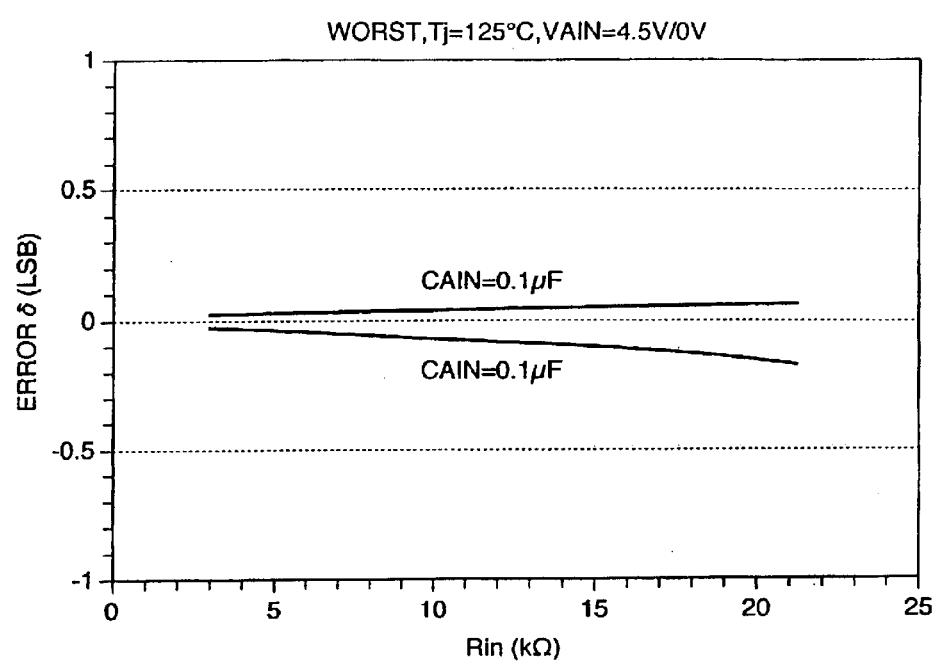
Figure 19:
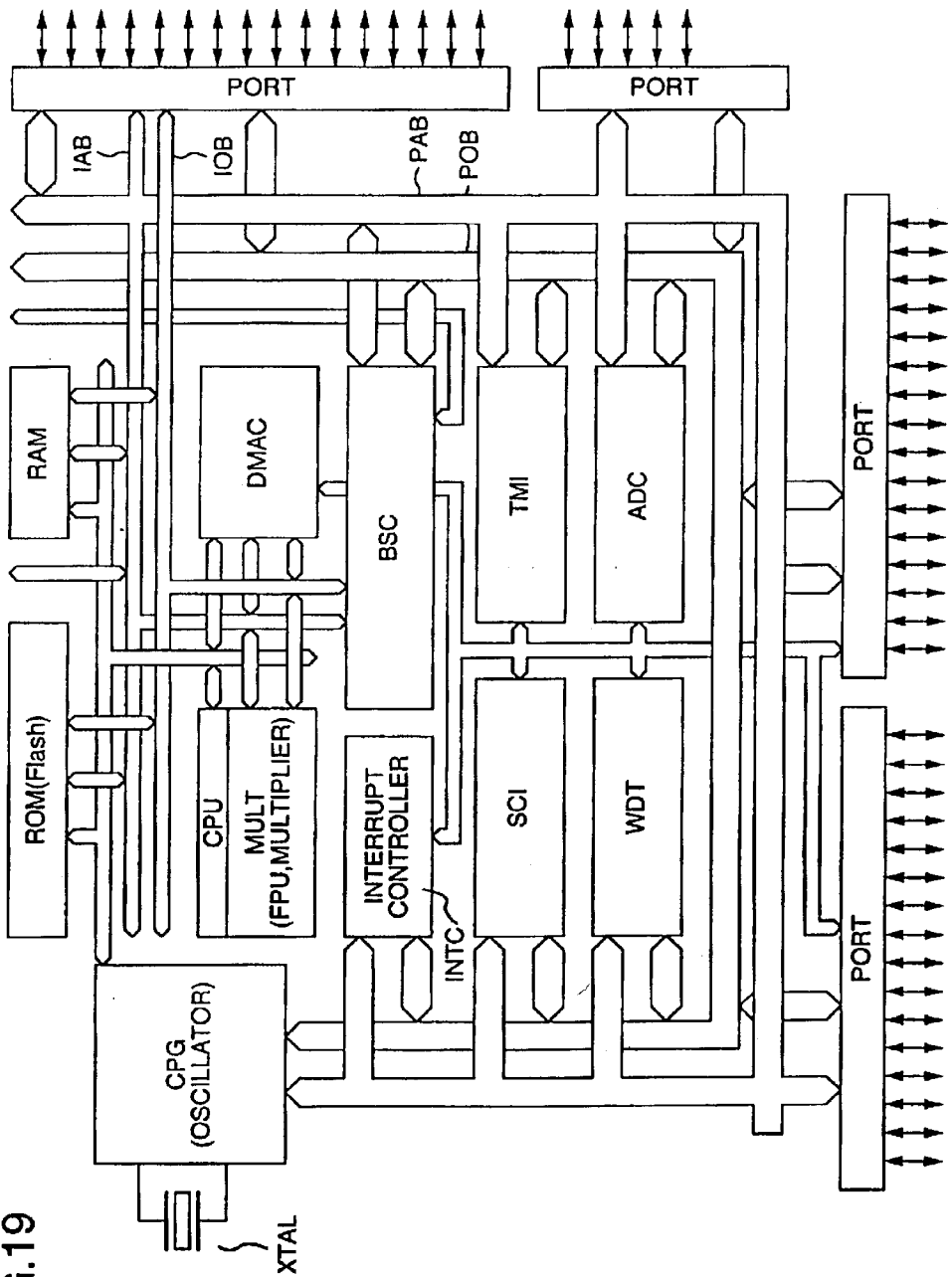
Figure 20:
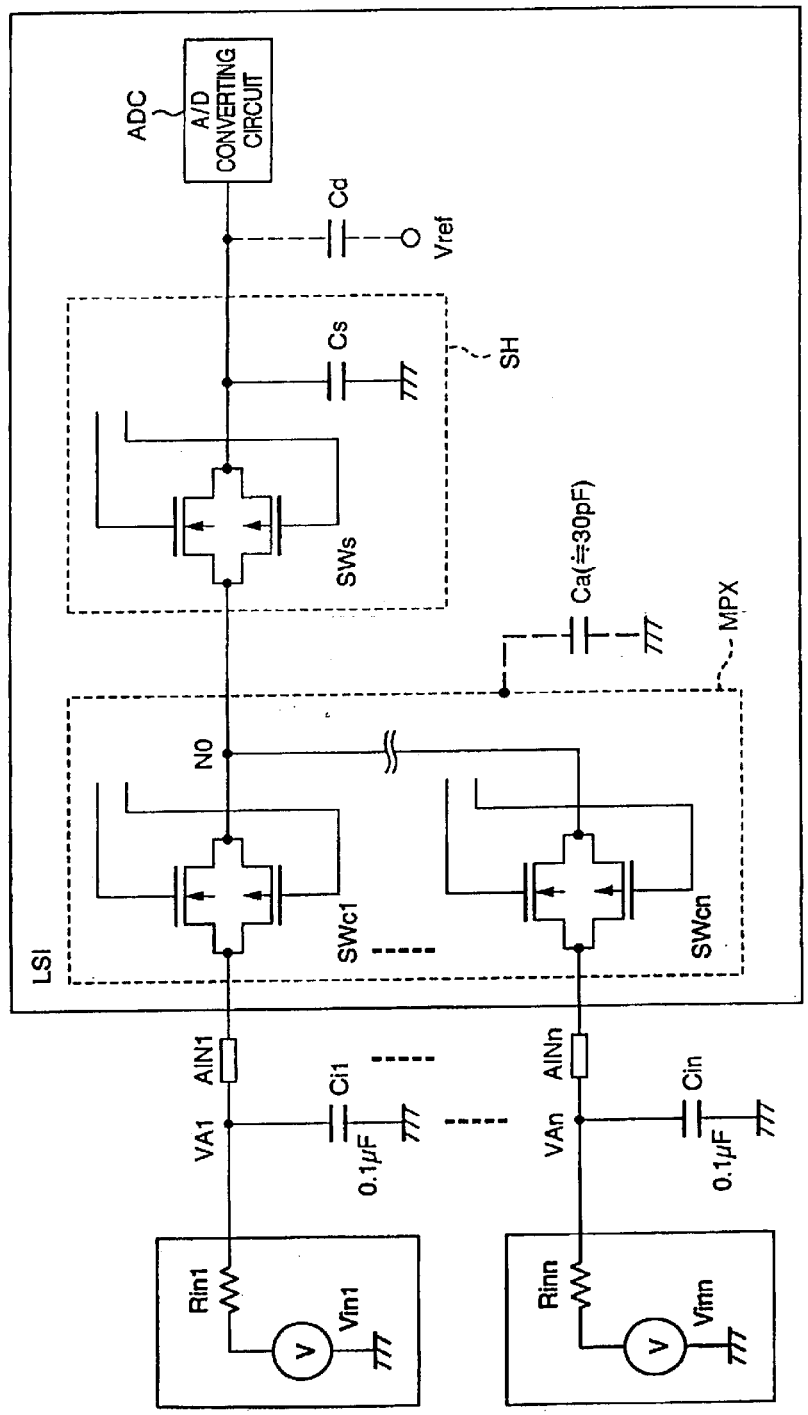
Figure 21:
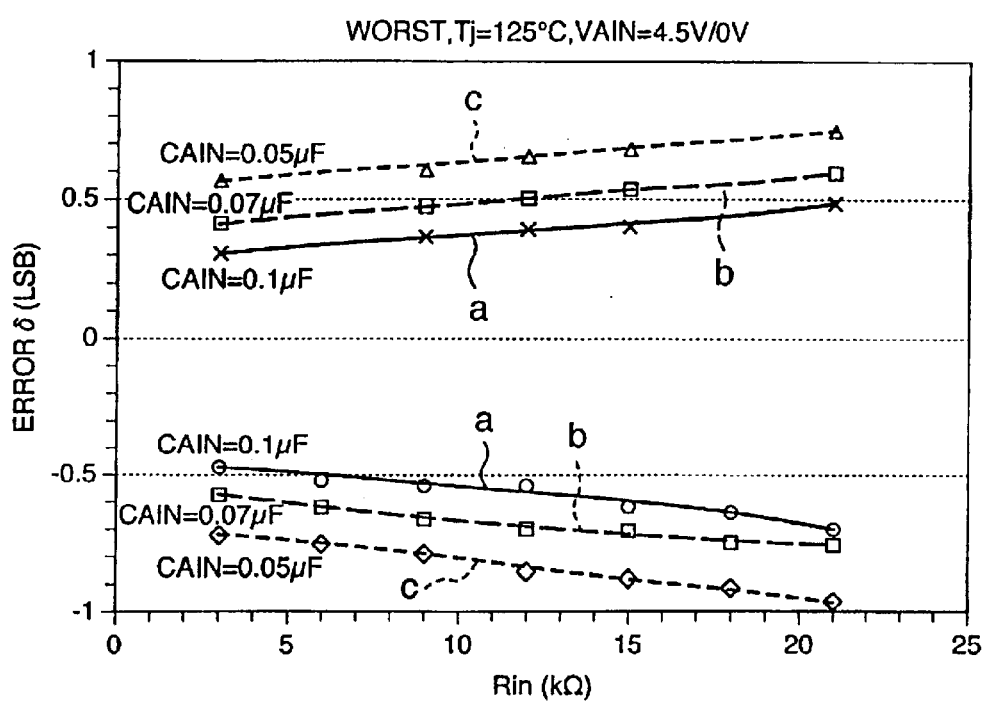
Figure 22:
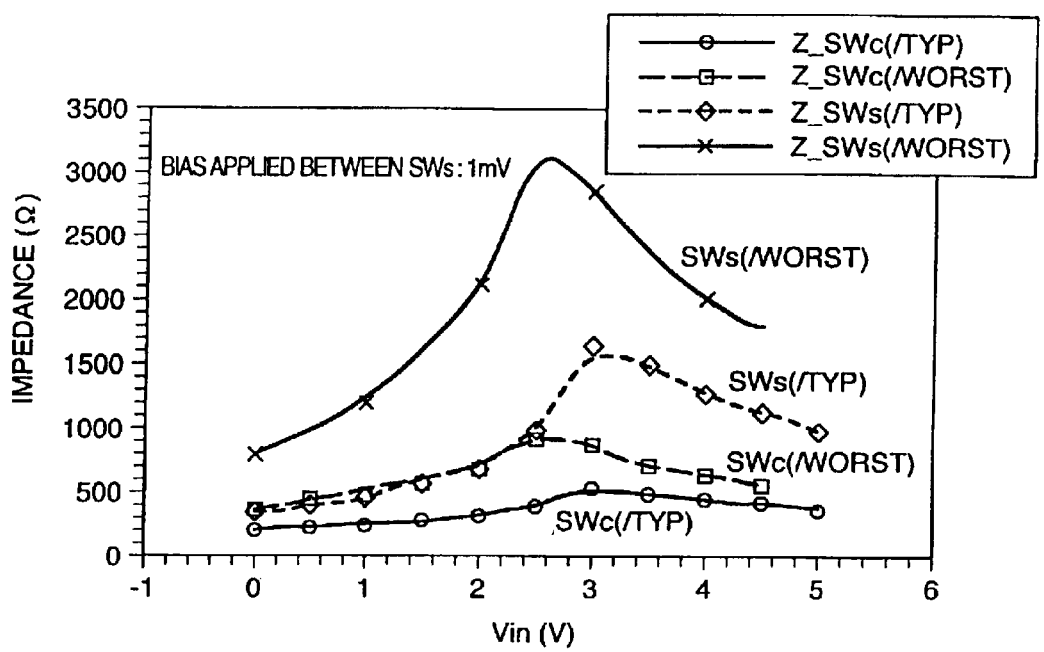
Figure 23:
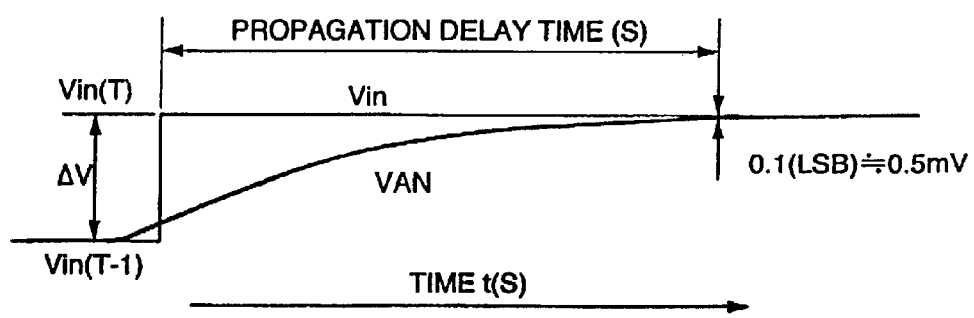
Figure 24:
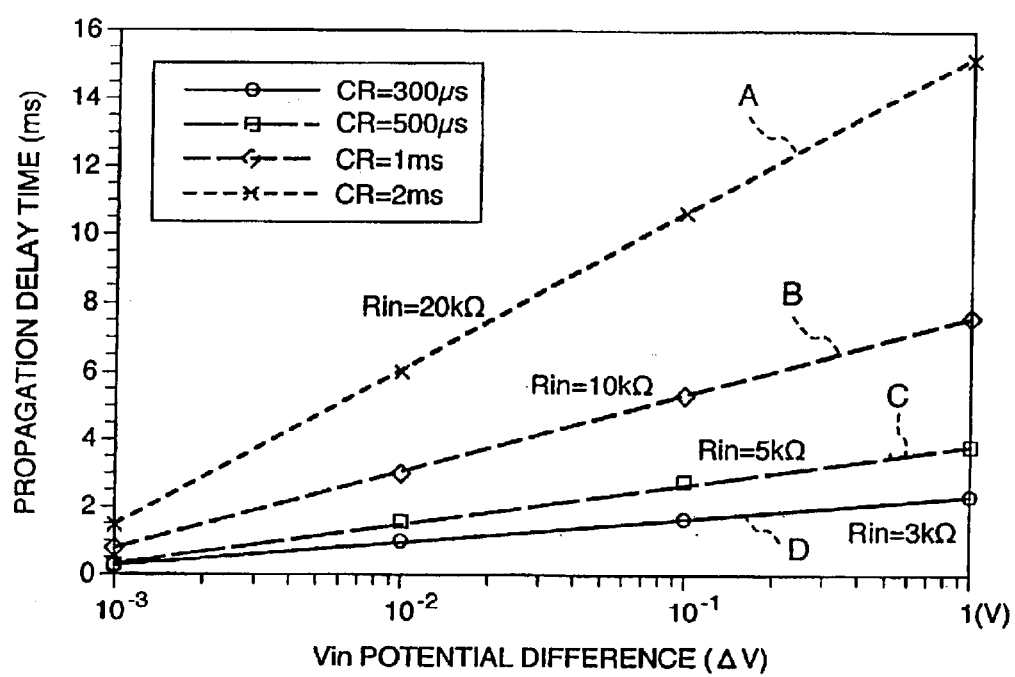

FIG. 9 is a circuit diagram for indicating a sample-and-hold circuit for an analog voltage, according to a first embodiment of the present invention;

FIG. 10 is a circuit diagram for indicating a sample-and-hold circuit for an analog voltage, according to a second embodiment of the present invention;

FIG. 11 is a circuit diagram for indicating a sample-and-hold circuit for an analog voltage, according to a third embodiment of the present invention;

FIG. 12 is a circuit diagram for indicating an analog multiplexer circuit according to an embodiment of the present invention;

FIG. 13 is a timing chart for showing timing of a control signal of the analog multiplexer circuit according to this embodiment;

FIG. 14 is a circuit for representing an analog multiplexer circuit according to another embodiment of the present invention;

FIG. 15 is a circuit diagram for representing an A/D converting circuit according to an embodiment of the present invention;

FIGS. 16A–H are timing charts for representing an example of the control timing of the A/D converting circuit according to the present invention;

FIG. 17 is a timing chart for representing another example of the control timing of the A/D converting circuit according to the present invention;

FIG. 18 is a graphic representation for representing a relationship between an internal impedance of an analog signal source employed in an A/D converting circuit, and an error $\delta(LSB)$ of an analog input voltage sampled by a sample-and-hold circuit, to which the present invention is applied;

FIG. 19 is a block diagram for showing a structural example of a single-chip microcomputer functioning as one example of a suitable system LSI, while using the A/D converting circuit according to the present invention;

FIG. 20 is a block diagram for indicating a schematic arrangement of a system which A/D-converts a plurality of analog signals in a time divisional manner;

FIG. 21 is a graphic representation for showing the relationship between the internal impedance Rin of the analog signal source and the error $\delta(LSB)$ of the analog input voltage to be sampled in the conventional A/D converting circuit operated in the time divisional system;

FIG. 22 is a graphic representation for indicating the relationship among the impedance of the MOSFET which constitutes the multiplexer circuit, the impedance of the MOSFET which constitutes the sample-and-hole circuit, and the analog input voltage Vin;

FIG. 23 is a diagram for indicating the condition of the voltage changes at the terminal into which the analog signal is inputted when the voltage change of "$\Delta V$" is produced in the analog signal source; and FIG. 24 is a graphic representation for representing the relationship between the magnitude of the voltage change "$\Delta V$" in the analog signal source, and the propagation delay time of the terminal to which the analog signal is inputted when this voltage change occurs, while the internal impedance of the analog signal source is used as the parameter.

DESCRIPTION OF THE EMBODIMENTS

Referring now to drawings, embodiments of the present invention will be described in detail.

Figure 1:
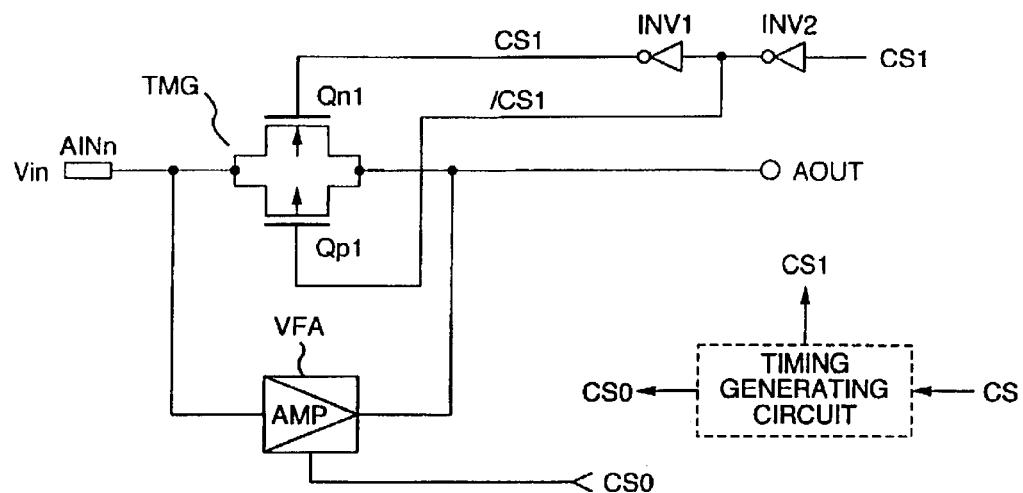
FIG. 1 is a circuit diagram for representing an analog switch circuit according to a first embodiment of the present invention.

FIG. 1 is an analog switch circuit according to a first embodiment of the present invention. In FIG. 1, symbol "AIN" shows an analog input terminal; symbol "AOUT" denotes an analog output terminal; symbol "TMG" represents a transfer gate connected between the above-described analog input terminal AIN and the analog output terminal AOUT; symbol "VFA" indicates a voltage follower amplifier which is connected in parallel to the above-described CMOS transfer gate TMG between the analog input terminal AIN and the analog output terminal AOUT; and symbols "INV1" and "INV2" denote inverters for inverting a control signal CS1. The transfer gate TMG is constituted by such a CMOS transfer gate in which a p-channel MOSFET Qp1 is connected in parallel to an n-channel MOSFET Qn1.

Then, both the p-channel MOSFET Qp1 and the n-channel MOSFET Qn1, which constitute the above-explained CMOS transfer gate TMG, are simultaneously brought into either ON states or OFF states by supplying one pair of control signals "CS1" and "/CS1" to gate terminals of these p-channel/n-channel MOSFETs Qp1/Qn1. This control signal CS1 owns a phase opposite to that of the remaining control signal /CS1. The voltage follower amplifier VFA is constituted by such a differential amplifying circuit, the output terminal of which is connected to the inverting input terminal thereof. In response to a control signal "CS0", this voltage follower amplifier VFA may be controlled under either an active state or a non-active state (inactive state). Under this active state, the voltage follower amplifier VFA is operated in such a manner that a voltage Vin having the same level as a level of an input voltage may be outputted to the output terminal AOUT.

Figure 2:
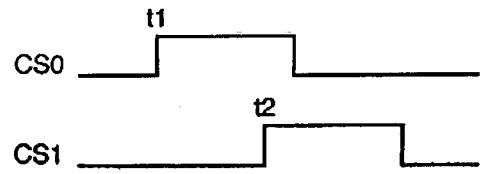
FIG. 2 is a timing chart for representing timing of a control signal of the analog switch circuit according to the first embodiment.

The analog switch circuit according to this embodiment is controlled in response to the control signals CS1 and CS0, which are supplied thereof at such timing as shown in FIG. 2. Concretely speaking, first of all, the voltage follower amplifier VFA is brought into the active state at timing "t1" in response to the control signal CS0, and then, the output voltage of this voltage follower amplifier VFA is changed into the same level as that of the input voltage Vin. Subsequently, in response to the control signal CS1, both the p-channel MOSFET Qp1 and the n-channel MOSFET Qn1, which constitute the CMOS transfer gate TMG, are simultaneously brought into ON states at timing "t2", so that this CMOS transfer gate TMG transfers the analog input voltage Vin entered into the analog input terminal AIN to the analog output terminal AOUT.

In the conventional analog switch circuit having no such a voltage follower amplifier VFA, when the potential difference between the analog input voltage Vin and the voltage which has been charged into the stray capacitance existed on the side of the output terminal thereof is high, the level of the voltage transferred by the analog switch is adversely influenced before both the p-channel MOSFET Qp1 and the n-channel MOSFET Qn1, which constitute the CMOS transfer gate TMG, are turned ON. To the contrary, in the analog switch circuit according to this embodiment, the voltage follower amplifier VFA is firstly brought into the active state, and then, the output voltage of this voltage follower amplifier VFA is changed toward the same level as that of the input voltage. As a result, both the p-channel MOSFET Qp1 and the n-channel MOSFET Qn1, which constitute the CMOS transfer gate TMG, are turned ON.

As a result, just before the CMOS transfer gate TMG is turned ON, the potential difference between the analog input voltage Vin and the charged voltage of the stray capacitance existed on the side of the output terminal may become very small. Even when the CMOS transfer gate TMG is turned ON under this condition, substantially no adverse influence is given to the level of the voltage which is transferred by the switch. Also, after the CMOS transfer gate TMG has been turned ON, since the voltage follower amplifier VFA is brought into the non-active state, even when the voltage follower amplifier VFA owns an offset due to fluctuations of structural elements, the correct input voltage level can be transferred to the output terminal by the CMOS transfer gate TMG.

It should be noted that in the timing chart shown in FIG. 2, a portion of the high-level period of the control signal CS0 is overlapped with a portion of the high-level period of the control signal CS1. Alternatively, as represented in FIG. 3(B) and FIG. 3(C), the CMOS transfer gate TMG may be controlled in response to such signals, the high-level periods of which are not overlapped with each other. Also, the control signal CS0 may be made as a control signal having such timing that this control signal falls to a low level before the voltage follower amplifier VFA sets a level of an output voltage to such a level which is completely equal to a level of an input voltage, by which the voltage follower amplifier VFA is brought into the non-active state.

Furthermore, as indicated by a broken line, a timing generating circuit TG may be provided in the vicinity of the analog switch circuit. This timing generating circuit TG generates both such a control signal CS0 as indicated in FIG. 3(B), and also another control signal CS1 as indicated in FIG. 3(C) based upon such a control signal as indicated in FIG. 3(A) which is applied to the conventional analog switch. This control signal CS0 controls the voltage follower amplifier VFA of the first embodiment of FIG. 1, whereas the control signal CS1 controls the CMOS transfer gate TMG thereof. In this alternative case, a user may perform the completely same use method as that of the conventional analog switch circuit, so that the design work load given to the user may be reduced.

Figure 4:
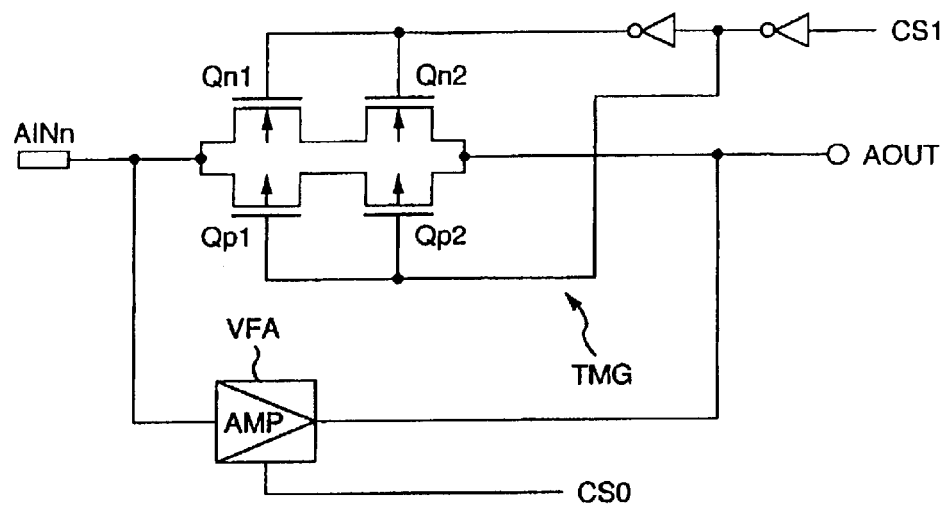
FIG. 4 is a circuit diagram for showing an analog switch circuit according to a second embodiment of the present invention.

FIG. 4 shows an analog switch circuit according to a second embodiment of the present invention. This analog switch circuit of the second embodiment is arranged as follows: That is, a p-channel MOSFET Qp2 and an n-channel MOSFET Qn2 are newly employed which are connected in series to the p-channel MOSFET Qp1 and the n-channel MOSFET Qn1, which constitute the CMOS transfer gate TMG employed in the analog switch circuit of the first embodiment of FIG. 1. These p-channel/n-channel MOSFETs Qp2/Qn2 are simultaneously turned ON/OFF in response to the same control signals CS1 and /CS1 as those of the respective MOSFETs Qp1 and Qn1, respectively.

This analog switch circuit of this second embodiment is completely identical to the above-mentioned analog switch circuit of the first embodiment shown in FIG. 1 in terms of operation. In the analog switch circuit of the first embodiment shown in FIG. 1, when the input voltage Vin is rapidly changed, there is such a risk that this change in the input voltages is transferred to the output terminal via the stray capacitances produced between the sources and the drains of the p-channel MOSFET Qp1 and the n-channel MOSFET Qn1 respectively, which constitute the CMOS transfer gate TMG. To the contrary, in the analog switch circuit of the second embodiment shown in FIG. 4, the p-channel MOSFET Qp2 is series-connected to the p-channel MOSFET Qp1, and also, the n-channel MOSFET Qn2 is series-connected to the n-channel MOSFET Qn1, which constitute the CMOS transfer gate TMG. As a result, this circuit may be equivalent to such a circuit that two stray capacitances produced between the sources and the drains of these p-channel/n-channel MOSFETs are series-connected between the input terminal AIN and the output terminal AOUT. Therefore, there is such a merit that even when the input voltage Vin is rapidly changed, this voltage change can be hardly transferred to the output terminal side.

As explained in the second embodiment of FIG. 4, in the case of such an analog switch circuit in which MOSFETs are series-connected to each other, an input resistance of this analog switch circuit may become higher than an input resistance of another analog switch constituted by a single MOSFET. However, since the input resistance may be reduced by conducting such a measure that gate widths of these MOSFETs are made wider than a gate width of such a single MOSFET, there is no problem.

Figure 5:
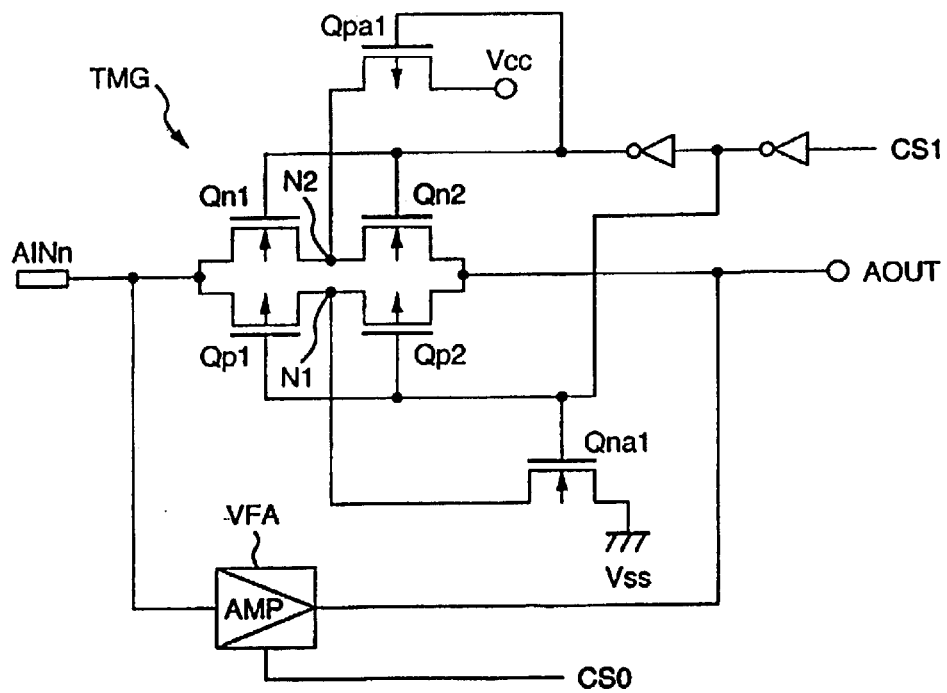
FIG. 5 is a circuit diagram for indicating an analog switch circuit according to a third embodiment of the present invention.

FIG. 5 shows an analog switch circuit according to a third embodiment of the present invention. This analog switch circuit of the third embodiment is arranged as follows: That is, an n-channel MOSFET Qna1 is connected between the ground point and a coupling node N1 of the series-connected p-channel MOSFETs Qp1 and Qp2, and also, a p-channel MOSFET Qpa1 is connected between the power supply voltage Vcc and another coupling node N2 of the series-connected n-channel MOSFETs Qn1 and Qn2, which constitute the CMOS transfer gate TMG employed in the analog switch circuit of the second embodiment shown in FIG. 4.

Then, the p-channel MOSFET Qpa1 connected to the above-described node N1 is turned ON/OFF in response to the control signal CS1 used for the n-channel MOSFETs Qn1 and Qn2. Also, n-channel the MOSFET Qna1 connected to the node N2 is turned ON/OFF in response to the control signal /CS1 used for the p-channel MOSFETs Qp1 and Qp2 in a complementary manner with respect to the p-channel MOSFETs Qp1 and Qn1. In other words, when the MOSFETs Qp1, Qp2, Qn1, and Qn2 are turned ON, these MOSFETs Qpa1 and Qna1 are turned OFF, whereas when the MOSFETs Qp1, Qp2, Qn1, and Qn2 are turned OFF, these MOSFETs Qp1 and Qna1 are turned ON. As a result, when the analog switch circuit is set under OFF state, it is possible to avoid that both the coupling node N1 of the series-connected p-channel MOSFETs Qp1 and Qp2, and the coupling node N2 of the series-connected n-channel MOSFETs Qn1 and Qn2 are brought into floating states in view of the potential aspect. Since these nodes N1 and N2 are fixed to the ground potential and the power supply voltage Vcc, respectively, such an operation can be prevented. That is, while the analog switch circuit is under OFF state, the change in the input voltages is transferred to the output terminal via the stray capacitances between the sources and the drains, and also via the parasitic bipolar transistor structural portion.

It should be noted that in the third embodiment of FIG. 5, the node N1 is fixed to the ground potential, and the node N2 is fixed to the power supply voltage Vcc. Alternatively, the node N1 may be fixed to the power supply voltage Vcc, and the node N2 is fixed to the ground potential. Also, both the node N1 and the node N2 may be fixed to the same potential. Furthermore, as explained later, since device structural arrangements are applied to the analog switch circuit, a change in input voltages may be hardly transferred to the output terminal.

Figure 6:
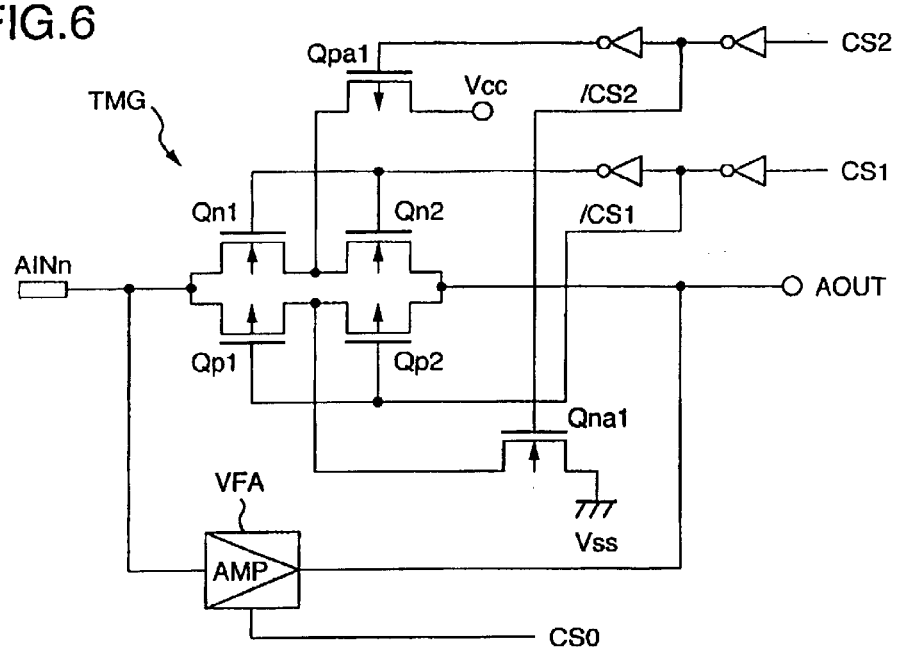
FIG. 6 is a circuit diagram for indicating an analog switch circuit according to a fourth embodiment of the present invention.

FIG. 6 shows an analog switch circuit according to a fourth embodiment of the present invention. This analog switch circuit of the fourth embodiment is arranged as follows: Instead of controlling the MOSFETs Qpa1 and Qna1 by the control signals CS1 and /CS1 used for the MOSFETs Qp1, Qp2, Qn1, and Qn2, which are provided in order to fix the potentials at the node N1 and the node N2 employed in the third embodiment of FIG. 5, these MOSFETs Qpa1 and Qna1 are turned ON by using other control signals CS1 and /CS2 when the MOSFETs Qp1, Qp2, Qn1, and Qn2 are turned OFF, whereas these MOSFETs Qpa1 and Qna1 are turned OFF when the MOSFETs Qp1, Qp2, Qn1, and Qn2 are turned ON.

Figure 7:
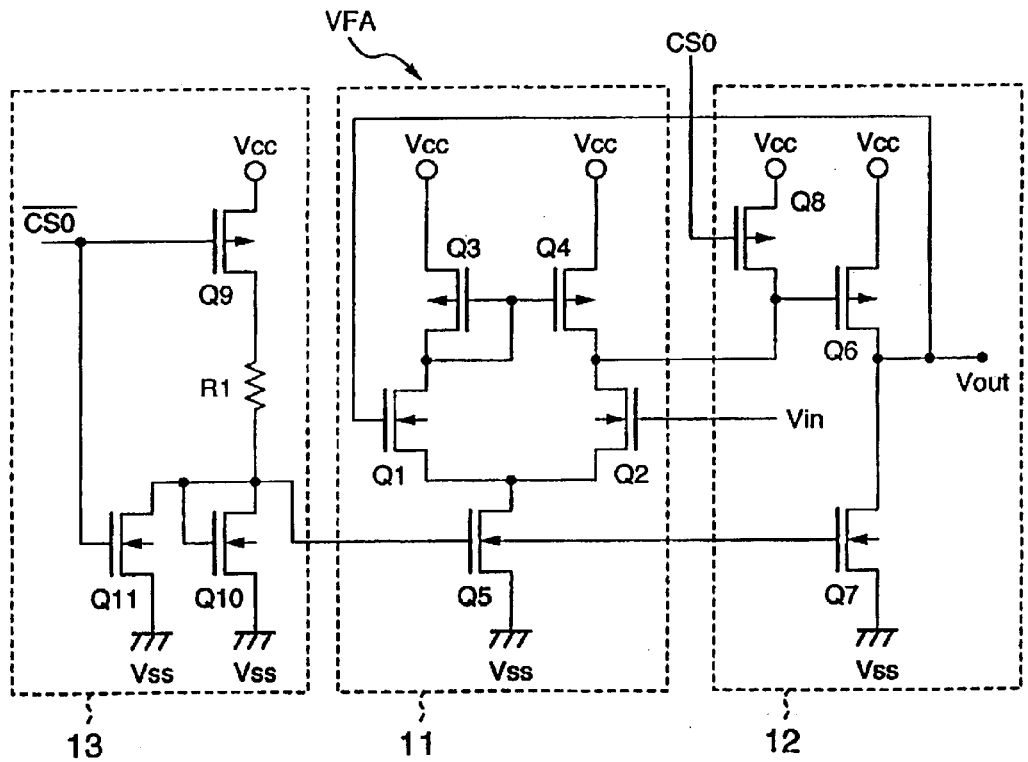
FIG. 7 is a circuit diagram for representing a concrete circuit example of a voltage follower amplifier.

FIG. 7 represents a concrete circuit example of the above-described voltage follower amplifier VFA.

As indicated in FIG. 7, the voltage follower amplifier VFA of this embodiment is constituted by a differential input stage 11, an output stage 12, and a bias stage 13. Among these circuit stages, the differential input stage 11 is constructed of a general-purpose differential amplifying circuit. This differential amplifying circuit is constituted by differential MOSFETs Q1 and Q2, the sources of which are commonly connected to each other; active load MOSFETs Q3 and Q4 which are connected to the drain sides of the differential MOSFETs Q1 and Q2; and an MOSFET Q5 used for a current source. This MOSFET Q5 is connected between the ground point and the commonly-connected sources of the differential MOSFETs Q1 and Q2. Then, the input voltage Vin is applied to a gate terminal of the differential MOSFET Q2.

The output stage 12 is arranged by an output MOSFET Q6 in which a potential of an inverting-sided output node of the differential input stage 11 is received by the gate thereof; an MOSFET Q7 used for a current source, which is connected in series to this output MOSFET Q6; and a switch MOSFET Q8. This switch MOSFET Q8 is connected between the gate of the output MOSFET Q6 and the power supply voltage Vcc, and is turned ON/OFF in response to the control signal CS0. Then, a voltage of the drain side of the output MOSFET Q6 is fed back to the gate of the differential MOSFET Q1 of the differential input stage 11. As a result, the differential input stage 11 is operated in such a manner that the input voltage Vin of the MOSFET Q2 is made coincident with the gate voltage of the MOSFET Q1, and also, such a voltage Vout having the same level as that of the input voltage Vin is outputted from the output stage 12.

The bias stage 13 is arranged by a p-channel MOSFET Q9 series-connected between the power supply voltage Vcc and the ground point; a resistor R1; an n-channel MOSFET Q10 which is connected in a diode manner; and also, an n-channel MOSFET Q11. This n-channel MOSFET Q11 is connected between a drain of the n-channel MOSFET Q10 and the ground point, and is turned ON/OFF in response to the control signal /CS0. While the control signal /CS0 is also applied to a gate of the above-explained MOSFET Q9, both the p-channel MOSFET Q9 and the n-channel MOSFET Q11 are ON/OFF-controlled in the complementary manner. When the level of the control signal /CS0 becomes a low level, the MOSFET Q9 is turned ON, so that a voltage Vb is produced, and this voltage Vb is defined by dividing the power supply voltage Vcc by such a ratio among an ON-resistance of the MOSFET Q9, a resistance value of the resistor R1, and a conductance of the MOSFET Q10. This voltage Vb is applied as a bias voltage to both the gate of the MOSFET Q5 for the current source employed in the differential input stage 11, and the gate of the MOSFET Q7 for the current source employed in the output stage 12. When the bias voltage Vb is applied to these gates, currents will flow through these MOSFETs Q5/Q7, so that the circuit is brought into the active state.

Also, when the level of the above-explained control signal /CS0 is set to a high level, the MOSFET Q9 is turned OFF and the MOSFET Q11 is turned OFF, so that the bias stage 13 stops the generation of the bias voltage Vb. As a result, both the current flowing through the MOSFET Q5 for the current source employed in the differential input stage 11, and the current flowing through the MOSFET Q7 for the current source employed in the output stage 12 are interrupted, and the voltage follower amplifier VFA stops the operation thereof.

Figure 8A:
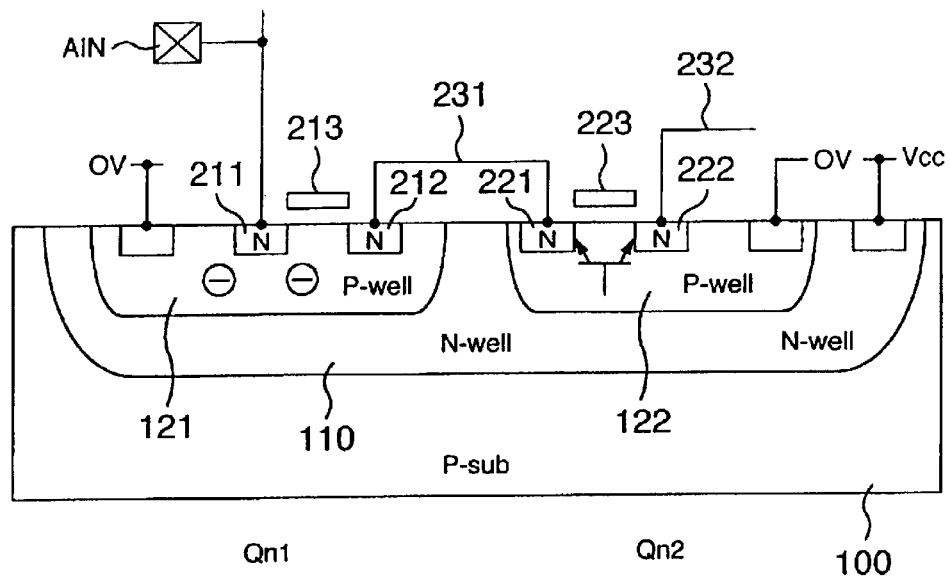
FIGS. 8A and 8B are a sectional view for showing an example of sectional structures of n-channel MOSFETs Qn1 and Qn2 connected in a series connection mode, which constitute a CMOS transfer gate TMG of an analog switch circuit and a sectional view of a typical m-channel MOSFET for comparison, respectively.

FIG. 8A indicates an embodiment of a structural diagram of the CMOS transfer gate TMG in a device level, employed in the analog switch circuit of FIG. 4. It should be understood that the device design of this embodiment may be applied not only to the device constructions of the CMOS transfer gates TMG employed in the analog switch circuits according to the third embodiment of FIG. 5 and the fourth embodiment of FIG. 6.

FIG. 8A illustratively shows a sectional structure of the n-channel MOSFETs Qn1 and Qn2 among the p-channel MOSFETs Qp1/Qp2 and the n-channel MOSFETs Qn1/Qn2, which constitute the CMOS transfer gate TMG.

As indicated in FIG. 8A, although no specific limitation is made in this embodiment mode, a relatively deep n-type well region 110 is formed on the side of a major surface of a p-type semiconductor substrate 100, and furthermore, two p-type well regions 121 and 122 are formed on the side of a surface of this n-type well region 110. Then, diffusion layers 211 and 212, and a gate electrode 213 are formed in the surface of one p-type well region 121. The diffusion layers 211 and 212 function as the source region and the drain region of the n-channel MOSFET Qn1 which constitutes the above-explained CMOS transfer gate TMG. Also, diffusion layers 221 and 222, and a gate electrode 223 are formed in the surface of the other p-type well region 122. The diffusion layers 221 and 222 function as the source region and the drain region of the n-channel MOSFET Qn2 which constitutes the above-explained CMOS transfer gate TMG.

The diffusion layer 211 of the n-channel MOSFET Qn1 is connected to the analog input terminal AIN, and also the diffusion layer 212 thereof is connected via a wiring line 231 made of aluminum and the like to the diffusion layer 221. Also, the diffusion layer 222 of the n-channel MOSFET Qn2 is connected via another wiring line 232 to the output terminal. Furthermore, while the ground potential is applied to the above-described p-channel semiconductor substrate 100, the power supply voltage Vcc is applied to the n-type well region 110, and also the ground potential is applied to both the p-type well regions 121 and 122, so that the PN junction is biased under reverse biasing condition.

Figure 8B:
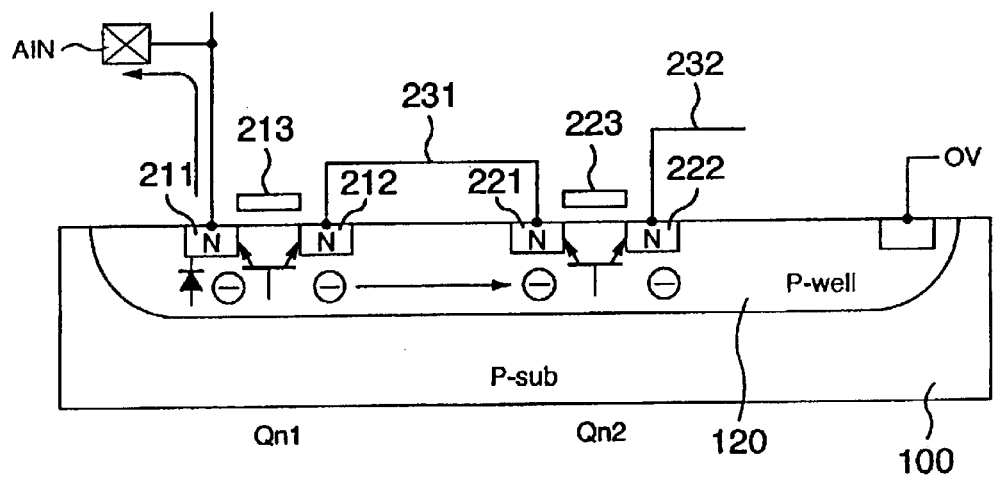

FIG. 8B illustratively shows a sectional structure of a typical n-channel MOSFETs connected in a series connection mode, for the sake of a comparison. In this drawing, reference numeral 120 shows a p-type well region; reference numerals 211 and 212 indicate diffusion layers functioning as the source region and the drain region of the n-channel MOSFET Qn1; and also reference numerals 221 and 222 represent diffusions functioning as the source region and the drain region of the n-channel MOSFET Qn2. As indicated in this drawing, in the typical n-channel MOSFETs connected in the serial connection mode, two MOSFETs are often formed on a single p-type well region 120.

The Inventors of the present invention could find out the below-mentioned problem: That is, in such a case that such n-channel MOSFETs connected in the series connection mode, which has been formed on the single p-type well region 120, are used as the n-channel MOSFETs Qn1 and Qn2 which constitute the CMOS transfer gate TMG of FIG. 4, if a negative potential is applied to the analog input terminal AIN due to some reason, then the output voltage is changed.

As a result of their investigations as to this reason, the Inventors of the present invention could come to such a conclusion that this reason could be explained based upon the below-mention assumption. In other words, as to such an analog switch which employs the MOSFETs having such a structure as shown in FIG. 8B, in the case that the negative potential is entered into the analog input terminal AIN which is connected to the diffusion layer 211 of the n-channel MOSFET Qn1 due to some reason, the PN junction between the p-type well region 120 and the n-type diffusion layer 211 is biased in the forward bias mode, so that a current will flow toward the analog input terminal AIN. As a result, minority carriers (electrons) are produced in the vicinity of the diffusion layer 211 of the p-type well region 120, and then, these minority carriers are diffused to an entire region of the p-type well region 120. As a result, electron charges will flow from the diffusion layer 222 which is connected to the side of the output terminal into this p-type well region 120 in order to neutralize these minority carriers, so that the output voltage is changed.

On the other hand, as to such an analog switch which employs the MOSFETs having the structure as shown in FIG. 8A, since the n-channel MOSFETs Qn1 and Qn2 are formed on the separated p-type well regions 121 and 122 respectively, even when the following phenomenon occurs, these minority carriers are not diffused into the p-type well region 122. That is to say, even when the negative potential is entered into the analog input terminal AIN which is connected to the diffusion layer 211 of the n-channel MOSFET Qn1, so that a current will flow toward the analog input terminal AIN, and thus, minority carriers (electrons) are produced in the vicinity of the diffusion layer 211 of the p-type well region 121, these minority carriers are not diffused to the p-type well region 122 of the MOSFET Qn2. Accordingly, it is possible to avoid such a condition that electronic charges will flow from the diffusion layer 222 which is connected to the side of the output terminal into this p-type well region 122 in order to neutralize these minority carriers, so that the output voltage is changed.

On the other hand, considering such a case that a relatively deep potential is entered into the analog input terminal, even when the MOSFETs Qn1 and Qn2 are separately formed on the p-type well regions 121 and 122 as represented in FIG. 8A, the following operation may be conceived. That is, a current may flow to the analog input terminal AIN, so that a potential appeared in the vicinity of the diffusion layer 211 of the p-type well region 120 is lowered, a bipolar transistor which is parasitically formed in the diffusion layers 211 and 212 of the n-channel MOSFET Qn1 becomes conduct. Then, this lowered potential is transferred to the diffusion layer 221 via a wiring line which is used to connect between the n-channel MOSFETs Qn1 and Qn2, and thus, a bipolar transistor which is parasitically formed in the diffusion layers 221 and 222 of the n-channel MOSFET Qn2 becomes conduct, so that a current may flow and therefore, an output voltage may be changed.

However, as explained in the embodiments of FIG. 5 and FIG. 6, the potential at the diffusion layer 221 of the MOSFET Qn2 is fixed in such a case that while the MOSFET Qp2 is connected between the power supply voltage Vcc and the connection node N2 (namely, wiring line 140 of FIG. 8B) between the n-channel MOSFETs Qn1 and Qn2, when the n-channel MOSFETs Qn1 and Qn2 are turned OFF, the p-channel MOSFET Qpa1 is turned ON so as to fix the potential at the connection node N2 to the power supply voltage Vcc. As a consequence, the following phenomenon can be more effectively prevented. That is, since the negative potential is entered into the analog input terminal AIN, the minority carriers (electrons) are produced in the vicinity of the diffusion layer 211 of the p-type well region 120, and then, these minority carriers are diffused into the p-type well region 120. Even when the potential at the diffusion layer 212 of the n-channel MOSFET Qn1 is lowered, this lowered potential is transferred to the diffusion layer 221 of the n-channel transistor Qn2, so that the bipolar transistor which is parasitically produced in the diffusion layers 221 and 222 of the n-channel MOSFET Qn2 is turned ON, and therefore, the potential appeared on the output side is changed, which can be prevented by the above-described embodiments.

FIG. 8A represents such sectional structures of the n-channel MOSFETs Qn1 and Qn2 among the p-channel MOSFETs Qp1/Qp2 and the n-channel MOSFETs Qn1/Qn2, which constitute the CMOS transfer gate TMG. Alternatively, even when the p-channel MOSFETs Qp1 and Qp2 similarly employ such a structure that the well regions are separated, a similar effect may be achieved.

FIG. 9 represents a sample-and-hold circuit for an analog voltage, according to a first embodiment of the present invention. The sample-and-hold circuit of this first embodiment owns such a construction that while the analog switch circuit of the first embodiment shown in FIG. 1 is used, a sampling capacitor Cs is connected between the output terminal of this analog switch circuit and the ground point.

Similarly to the analog switch circuit of the first embodiment shown in FIG. 1, also, in the sample-and-hold circuit of this first embodiment, the voltage follower amplifier VFA is firstly brought into the active state, and the output voltage thereof is changed into the same level as the level of the input voltage. Thereafter, both the p-channel MOSFET Qp1 and the n-channel MOSFET Qn1 are turned ON, which constitute the CMOS transfer gate TMG. Then, the analog input voltage Vin is conducted into the sampling capacitor Cs, whereas when both the p-channel MOSFET Qp1 and the n-channel MOSFET Qn1 are turned OFF, the charged voltage of the sampling capacitor Cs is held.

In this sample-and-hold circuit of the first embodiment, when the CMOS transfer gate TMG is turned ON due to the immediately-before operation of the voltage follower amplifier VFA, a potential difference becomes very small, and this potential difference is defined between the input voltage Vin and the charged voltage of the stray capacitance existed on the side of the output terminal. As a consequence, even when the CMOS transfer gate TMG is turned ON under this condition, the level of the input voltage which is transferred by the analog switch is not substantially and adversely influenced by the charged electrons of the stray capacitance. Further, after the CMOS transfer gate TMG has been turned ON, or just before this CMOS transfer gate TMG is turned ON, the voltage follower amplifier VFA is brought into the non-active state. As a result, even when the voltage follower amplifier VFA owns the offset due to the fluctuation in the structural elements, the input voltage can be correctly transferred by way of the CMOS transfer gate TMG.

Figure 3:
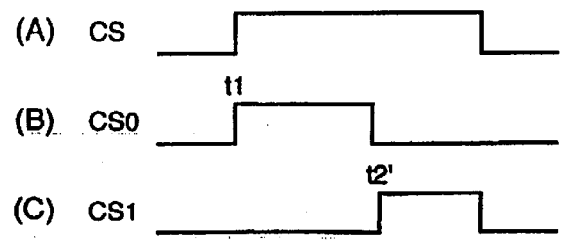
FIGS. 3A–C are timing charts for showing another example of a control signal of the analog switch circuit according to the first embodiment.

It should be noted that similar to the embodiment shown in FIG. 3, also in the embodiment indicated in FIG. 9, it may become effective to employ such a timing generating circuit. This timing generating circuit generates the control signals CS0 and CS1 used to control the MOSFETs Qp1 and Qn1 which constitute the analog switch circuit, and also the voltage follower amplifier VFA in response to the supplied control signal CS. As a consequence, it is possible to achieve such a similar effect that the provision of this timing generating circuit may reduce the designing work load of the user.

FIG. 10 represents a sample-and-hold circuit for an analog voltage, according to a second embodiment of the present invention. The sample-and-hold circuit of this second embodiment owns such a construction that while the analog switch circuit of the second embodiment shown in FIG. 5 is used, a sampling capacitor Cs is connected between the output terminal of this analog switch circuit and the ground point.

Similarly to the analog switch circuit of the second embodiment shown in FIG. 5, also, in the sample-and-hold circuit of this second embodiment, the p-channel MOSFET Qp2 is connected in series to the p-channel MOSFET Qp1, and also the n-channel MOSFET Qn2 is connected in series to the n-channel MOSFET Qn1, while both the p-channel/n-channel MOSFETs Qp1/Qn1 constitute the CMOS transfer gate TMG. As a result, this sample-and-hold circuit may be equivalent to such a circuit that two sets of stray capacitances produced between the sources and the drains are series-connected between the input terminal AIN and the sampling capacitance Cs. Therefore, there is such a merit that even when the input voltage Vin is rapidly changed, this voltage change can be hardly transferred to the sampling capacitor Cs.

Also, in this sample-and-hold circuit of the second embodiment, it is preferable to utilize such a circuit having the device structure as represented in FIG. 8 as the analog switch circuit. As a consequence, when the negative potential is inputted to the input terminal, the adverse influence caused by this negative potential can be hardly transferred to the side of the sampling capacitance.

FIG. 11 represents a sample-and-hold circuit for an analog voltage, according to a third embodiment of the present invention. The sample-and-hold circuit of this third embodiment owns such a construction that while the analog switch circuit of the third embodiment shown in FIG. 6 is used, a sampling capacitor Cs is connected between the output terminal of this analog switch circuit and the ground point.

Similarly to the analog switch circuit of the third embodiment shown in FIG. 6, also, in the sample-and-hold circuit of this third embodiment, it is possible to avoid such a condition that when the analog switch circuit is brought into an OFF state, potential-fixing MOSFETs Qpa1 and Qna1 are turned ON, so that both the coupling node N1 of the p-channel MOSFETs Qp1/Qp2 connected in the series connection mode, and also, the coupling node N2 of the n-channel MOSFETs Qn1/Qn2 are brought into the floating states in view of the potential aspect. Thus, the respective nodes N1 and N2 can be fixed to both the ground potential and the power supply voltage Vcc, respectively. As a result, it is possible to suppress transferring of a change in input voltages to the sampling-capacitance Cs via both the stray capacitance produced between the source and the drain, and also the parasitic bipolar transistor structural element portion while the analog switch is turned OFF.

Also, in this sample-and-hold circuit of the third embodiment, it is preferable to utilize such a circuit having the device structure as represented in FIG. 8 as the analog switch circuit. As a consequence, when the negative potential is inputted to the input terminal, the adverse influence caused by this negative potential can be hardly transferred to the side of the sampling capacitance.

FIG. 12 represents an analog multiplexer circuit according to a first embodiment of the present invention. This analog multiplexer circuit of the first embodiment owns such an arrangement that one end of each of the analog switch circuits ASW1, ASW2, - - -, ASWn of the first embodiment shown in FIG. 1 are connected to each of the plural analog input terminals AIN1, AIN2, - - -, AINn, and further, other ends of these analog switch circuits are connected to a common output terminal Aout.

It should also be noted that elements to which symbols "TMG1" to "TMGn" are applied in FIG. 12 represent such CMOS transfer gates, each of which is constituted by the p-channel MOSFET Qp1 and the n-channel MOSFET Qn1 in the first embodiment of FIG. 1. It should also be understood that these CMOS transfer gates TMG1 to TMGn are not limited to the constructions shown in FIG. 1, but may be realized by employing such structures similar to those of the CMOS transfer gates TMG of the analog switch circuits represented in FIG. 3, FIG. 5, and FIG. 6. As a result, similar effects as those of the respective embodiments may be achieved.

The analog multiplexer circuit of this first embodiment is operated as follows: That is, as indicated in a timing chart of FIG. 13, since a signal level of any one of control signals CS01, CS02, - - -, CS0n and also control signals CS11, CS12, - - -, CS1n, which control the analog switch circuits ASW1, ASW2, - - -, ASWn is selectively changed into a high level, the corresponding analog switch circuits ASW1, ASW2, - - -, ASWn are sequentially brought into a conducting condition, so that this analog multiplexer circuit transfers such a signal which is selected from signals supplied to the analog input terminals AIN1, AIN2, - - -, AINn. Moreover, while a switch is brought into the conductive state, first of all, voltage follower amplifiers VFA may become active in response to the control signals CS01, CS02, - - -, CS0n, and then a potential appeared on the output side is approached to a level of an input potential. Thereafter, the CMOS transfer gates TMG1 to TMGn are brought into conductive states in response to the control signals CS11, CS12, - - -, CS1n, so that this analog multiplexer circuit may transfer the correct input level.

FIG. 14 shows an analog multiplexer circuit according to a second embodiment of the present invention. This analog multiplexer circuit of the second embodiment is manufactured as a semiconductor integrated circuit (IC) on a single semiconductor chip in such a manner that a decoder circuit DEC is combined with such an analog multiplexer circuit MPX constructed as explained in the first embodiment of FIG. 12, and these multiplexer/decoder circuits are formed on this single semiconductor chip. FIG. 14 represents an arrangement of a multiplexer circuit as one example, and this multiplexer circuit selects one of 8 sorts of signals to output this selected signal.

In this drawing, symbols "S2", "S1", and "S0" indicate 3-bit select signals for designating that any one of input signals is selected; symbol "CS0" represents a signal for applying such timing at which a voltage follower amplifier VFA is brought into an active state; and also symbol "CS1" shows a signal for applying such timing at which a transfer gate TMG made of MOSFETs is turned ON. In the case that such a system is arranged with employment of an LSI (Large-Scale Integration) which contains either an A/D converting LSI or an A/D converting circuit, the multiplexer IC of this second embodiment is connected to a front stage of an analog input terminal of the A/D converting circuit, which may give a merit. Since this multiplexer IC is used, a user may merely design such a circuit capable of generating only the 3-bit select signals S0 to S2, and further, one set of timing signals CS0 and CS1. However, this user no longer requires to design another circuit capable of producing the timing control signals for the respective channels. As a result, there is such an advantage that the design work load given to the user can be reduced.

FIG. 15 shows an A/D converting circuit of an embodiment by using both the analog multiplexer circuit and the sample-and-hold circuit, as explained in the previous embodiment.

In FIG. 15, symbol "MPX" shows an analog multiplexer circuit for selecting one of plural analog input signals AIN0 to AINn; symbol "SH" represents a sample-and-hold circuit for sampling a selected analog input signal; and also symbol "ADC" shows an A/D converting circuit for converting a sampled analog signal into a digital signal corresponding thereto.

The A/D converting circuit ADC is constituted by a comparator CMP, a converted-result register REG, a D/A converting circuit DAC, a shift register SFR, a control circuit CNT, and also a control register CRG. The comparator CMP compares an input analog signal with a reference voltage Vref. The converted-result register REG is, for example, a 10-bit converted-result register for sequentially holding a converted result. The shift register SFR sequentially holds a 10-bit digital signal A/D-converted from each of the analog input signals. The control circuit CNT controls an entire circuit of this A/D converting circuit ADC. The control register CRG is used to set such control information as a designation sequence and a conversion sequence with respect to a control mode of the control circuit CNT and an analog signal to be converted.

In the sample-and-hold circuit SH employed in the A/D converting circuit ADC shown in FIG. 15, such a circuit shown in FIG. 9, FIG. 10, or FIG. 11 is used, whereas in the analog multiplexer circuit MPX, such a circuit indicated in FIG. 12 is used. Then, further, in the analog switch circuit employed in the circuit of FIG. 12, such a circuit shown in FIG. 1, FIG. 3, FIG. 5, or FIG. 6 is provided.

The control circuit CNT supplies the select signals S2, S1, S0 for the analog input signal, and the control signal CS0, CS1 with respect to the analog multiplex circuit MPX, and also supplies a sampling timing signal "φs" with respect to the sample-and-hold circuit SH. In addition, this control circuit CNT controls the D/A converting circuit DAC based upon a comparison result obtained by the comparator CMP, designates a bit used to hold a comparison result in the converted-result register REG, controls the shift operation of the shift register SFR, and/or outputs a value stored in the shift register SFR to a bus BUS.

The D/A converting circuit DAC is constituted by a resistor ladder RRD and a switch array SAL. This resistor ladder RRD divides a reference voltage "Vref0" by using a plurality of resistors. The switch array SAL selects any one of the subdivided reference voltages to apply the selected reference voltage to the comparator CMP.

The control circuit CNT first controls the comparator CMP to compare such an analog signal which is selected and entered thereinto with a comparison voltage of Vref/2 so as to store this comparison result into the register REG, and switches a voltage into a voltage of 3 Vref/4, which is applied from the D/A converting circuit DAC to the comparator CMP when the selected analog signal is higher than the comparison voltage of Vref/2 based upon the comparison result. On the other hand, when the selected analog signal is lower than the comparison voltage Vref/2, the control circuit CNT switches the voltage into a voltage of Vref/4, which is applied from the D/A converting circuit DAC into the comparator CMP.

While the control circuit CNT sequentially performs the above-explained voltage comparison and the switching operation of the comparison voltage and further holds the respective comparison results at the different bits of the register REG, the control circuit CNT gradually approximates such a comparison voltage to the analog input signal, and this comparison voltage is applied to the comparator CMP to the analog input signal. When the final bit is set to the register REG by sequentially repeating the voltage comparing operation, for instance, a value of a 10 bit which is held in the register REG corresponds to a digital value obtained after the A/D converting operation.

In the A/D converting circuit of this embodiment, as represented in FIG. 16(A), the sampling process operation and the A/D converting process operation are repeatedly carried out in an alternate manner. During a sampling time period, under such a condition that the analog switch of the sample-and-hold circuit SH is turned ON in response to such a sampling signal "φs" shown in FIG. 16(B), any one of the voltage follower amplifiers VFA employed in the analog multiplexer circuit MPX is brought into the active state in response to such select signals CS01 to CS0n as indicated in FIG. 16(C), FIG. 16(E), FIG. 16(G) at a front half sampling time period of each of the sampling time periods. Then, in response to such select signals CS1 to CS1n shown in FIG. 16(D), FIG. 16(F), FIG. 16(H), the MOSFET is turned ON at a rear half time period of each of the sampling time periods, so that the analog input signal may be transferred to the sample-and-hold circuit. Thereafter, both the select signals CS01 to CS0n, CS11 to CS1n, and also the sampling signal SMP are brought into OFF states (low levels), so that while the sampled signal is held by the sample-and-hold circuit SH, the A/D converting circuit is brought into the active state so as to execute the A/D converting process operation.

Furthermore, in the A/D converting circuit of this embodiment, as represented in FIG. 17, within such a time period "Tn" during which this A/D converting circuit performs the A/D converting process operation with respect to such an analog signal which is sampled in a certain cycle "n", with respect to an analog signal which should be sampled in the next cycle "n+1", the corresponding voltage follower amplifier VFA(n+1) may be brought into the active state. As a result, the cycle time of the A/D converting process operation may be shortened only by the activation time "t1" of the voltage follower amplifier shown in FIG. 16.

As previously described, in the A/D converting circuit of this embodiment, the voltage follower amplifier VFA is brought into the active state in the front half time period of the sampling time period, and also, the MOSFET of the analog switch is turned ON in the rear half time period of the sampling time period. As a result, when the analog switch is turned ON, the capacitor of the sample-and-hold circuit SH has already been charged, or discharged up to such a level approximated to the level of the analog input signal by way of the voltage follower amplifier VFA. As a consequence, as previously explained in the summary of the invention, the present invention can extremely reduce the adverse-influenced amount of the level of the next analog input signal when the MOSFET of the analog switch is turned ON, and this adverse-influenced amount is caused by the sampling electric charges which have been stored in the stray capacitor (namely, sampling capacitor in this embodiment) in the preceding cycle.

Accordingly, it is possible to reduce the capacitance values of the externally-connectable capacitors Ci to Cin which are required to be connected to the analog input terminals AIN1 to AINn so as to reduce the error of the analog input voltage which is sampled. As a result, even when the analog signal source owns the relative large internal impedance, since the input propagation delay time of the signal is shorter than that of the conventional circuit, even if the sampling time period, namely the time period of the A/D converting operation is not made long, then both the high-precision sampling result and also the high-precision A/D converting result can be obtained. Alternatively, such an analog signal source (sensor and high impedance noise preventing circuit) may be employed, and the internal impedance of this analog signal source is higher than that of the conventional A/D converting circuit.

FIG. 18 graphically shows a relationship between an internal impedance Rin of an analog signal source and an error $\delta$(LSB) contained in an analog input voltage Vin which is sampled by the sample-and-hold circuit SH in such a case that while the capacitance value of the externally-connectable capacitor Ci connected to the analog input terminals AIN1 to AINn is selected to be 0.1 $\mu$F, the control operation is carried out at the timing as indicated in FIG. 17 in the A/D converting circuit of this embodiment. The error $\delta$(LSB) may be expressed by the below-mentioned formula, assuming now that the resolution of the A/D converting circuit is 10 bits, the reference voltage is "Vref", and a voltage which is actually stored in the sampling capacitor Cs is "Vsmp":

$$\delta(LSB)=(Vin-Vsmp)/(Vref/1024)$$

A reduction degree of the error in the following assumption is represented in FIG. 18. This assumption is defined by that the input range of the analog input voltage Vin is selected to be 0V to 5V; the sampling time is selected to be 3.2 $\mu$S; the A/D converting time is selected to be 15 $\mu$S; the stray capacitance of the connection node between the analog multiplexer circuit and the sample-and-hold circuit is 50 pF; and also the potential difference between the analog input terminal and the output-sided node after the charging operation by the voltage follower amplifier is selected to be 100 mV. In the A/D converting circuit of this embodiment, the potential difference can be improved by 100 mV/5V, as compared with that of the conventional A/D converting circuit (FIG. 21), and the error can be reduced by approximately ⅕₀ in direct proportional to this improvement in the potential difference. Also, if the error "$\delta$" of the analog input voltage Vin is allowable as the same error of approximately +0.5(LSB) and −0.5(LSB) in the prior art, then such an externally-connectable capacitor having a capacitance of approximately 0.01 $\mu$F may be connected to the analog input terminal. As a consequence, in the case that the internal impedances of the analog signal sources are identical to each other, since the present invention is applied to the A/D converting circuit, the input propagation delay time may be reduced by approximately ⅟₁₀. As a result, even when the sampling time period is not made long, namely the time period of the A/D converting operation need not be prolonged, the high-precision sampling result and the high-precision A/D-converting result may be obtained.

Furthermore, in the case that signals derived from a plurality of analog signal sources such as sensors are A/D-converted by a single A/D converting circuit in a periodic manner, in such a system which employs the conventional multiplexer and the conventional sample-and-hold circuit, when an analog switch is turned ON in a periodic manner, the analog switch and an internal stray capacitor in combination operate similarly to a switched capacitor circuit. In this system, when the analog switch is turned ON, a charge voltage of a sampling capacitor is liable to leak to the side of the input terminal. In other words, the operation condition of this system is equal to such a condition that the input terminal and the output side are equivalently connected via a resistor to each other. As a result, the following phenomenon occurs. That is, the voltage drop which is directly proportional to the electron change stored in the internal stray capacitor is produced in the impedance component of the analog single source, so that the level of the analog input signal is shifted form the actual voltage value of the analog signal source. Contrary to that, when the present invention is applied to such a system, since the analog switch is turned ON after the potential difference between the input terminal and the output side thereof has been decreased, in such a case that a plurality of signals are sampled in the periodic manner by employing the multiplexer, a shift amount (deviation amount) of an analog input signal from the actual voltage value can be reduced.

Next, referring now to FIG. 19, a description will be made of an example of a suitably-designed system LSI with employment of the A/D converting circuit according to the above-explained embodiment. FIG. 19 represents a structural block diagram of a single-chip microcomputer as one example of such a system LSI containing the A/D converting circuit. Although no specific limitation is made in this example, the respective circuit blocks shown in FIG. 19 are manufactured on a single semiconductor chip such as single crystal silicon in accordance with the known manufacturing technique for semiconductor integrated circuits.

As indicated in FIG. 19, the microcomputer of this embodiment is equipped with a program control type central processing unit CPU, a read-only memory ROM, a random access memory RAM, a calculation unit MULT, and a DMA controller DMAC. The read-only memory ROM stores thereinto a program executed by the CPU, and fixed data which is required for control operation. The random access memory RAM provides a work area of the CPU, and further, temporarily stores thereinto such data which is obtained in connection with an execution of a program. The calculation unit MULT performs a calculation process operation such as a floating decimal point calculation and the multiplication, instead of calculations executed by the CPU. Instead of this CPU, the DMA controller DMAC executes a DMA (direct memory access) type data transfer operation between the internally-provided RAM and an externally-provided storage apparatus such as a hard disk apparatus. These various circuits are connected via a CPU address bus IAB and a CPU data bus IDB to each other.

In the microcomputer of this embodiment, both a peripheral address bus PAB and a peripheral data bus PDB are provided irrespective of the above-explained CPU buses IAB and IDB. To the peripheral address bus PAB and the peripheral data bus PDB, an interrupt controller INTC; a use brake controller UBC; a peripheral module; and an input/output port are coupled. The interrupt controller INTC issues an interrupt command with respect to the CPU based upon an issue of a preselected interrupt request. The user brake controller UBC requests the CPU to stop the execution of the program at a brake point which is designated by a user during emulation. The peripheral module is realized by, for example, a serial communication interface SCI which performs a serial communication among an analog-to-digital converting circuit ADC, a watch-dog timer used to detect an abnormal condition of hardware, and a timer circuit TIM external apparatus used to manage time. The input/output port PORT inputs/outputs a signal between this input/output port and an external apparatus. It should also be noted that both the CPU buses IAB and IDB to which the CPU is connected are also connected to this input/output port PORT, and thus, either the CPU or the DMAC may directly transmit/receive data with respect to the external apparatus.

Also, a bus state controller BSC is provided between the above-explained CPU buses IAB/IDB and the above-described peripheral buses PAB/PDB. This bus state controller BSC adjusts timing of signals appeared on these two buses so as to bridge signals between the CPU and the peripheral module. Although no specific limitation is made, the above-explained ROM is constituted by employing a flash memory in this embodiment. This flash memory is capable of erasing data in a batch mode in the unit of a predetermined data block. In addition, a clock generating circuit CPG is provided in this microcomputer, and generates a clock which is required for an internal operation of this microcomputer. A crystal oscillator XTAL having a preselected natural frequency is coupled via an external terminal to this clock generating circuit CPG. Then, as the above-explained A/D converting circuit ADC, such an A/D converting circuit as described in the embodiment of FIG. 15 is employed. In the automobile control system, as shown in FIG. 2, the detection signals derived from the various sorts of sensors are entered into this A/D converting circuit ADC so as to be A/D-converted into the various digital sensor signals. Then, these digital sensor signals are processed by the CPU and the like.

While the present invention has been described with reference to the embodiments exemplified by way of the concrete examples, the present invention is not limited only to the above-explained embodiments, but may be modified, changed, or substituted without departing from the scope and spirit of the present invention. For instance, in the above-described embodiment, as one example of the A/D converting circuit, such an example using the sequentially comparing type A/D converting circuit has been described. The present invention is not limited to such a sequentially comparing type A/D converting circuit, but may employ other types of A/D converting circuits, for sample, an electron charge redistributing type A/D converting circuit. Also, as the transfer gate which constitutes the analog switch, the present invention is not limited only to a COMS transfer gate, but may employ a single channel type MOSFET.

Also, while the present invention has been mainly described with respect to the single-chip microcomputer containing the A/D converting circuit which is used in the automobile control system corresponding to the utilization field, the present invention is not limited thereto. Alternatively, generally speaking, the present invention may be widely utilized in such an A/D converting circuit employed in a system in which a plurality of analog signals are A/D-converted by a single set of A/D converting circuit in a time divisional manner.

Some of the advantages which can be achieved by the typical inventive ideas among the disclosed present invention will now be simply explained as follows:

That is, in both the analog switch circuit and the multiplexer circuit, to which the present invention has been applied, the electron charges which have been stored in the stray capacitance before the switch is operated do not give adverse influence to the level of the next analog input voltage which is entered after the switch has been operated, but the analog signal can be transferred in high precision.

Also, in accordance with the A/D converting circuit to which the present invention has been described, even when the analog signal source having the high impedance is employed and also the filter circuit arrangement capable of withstanding the externally-supplied noise is used, the desirable A/D conversion precision can be obtained. Also, in accordance with the system in which a plurality of analog signals are A/D-converted by a single A/D converting circuit in the time divisional manner, while using the multiplexer, the sampling period can be shortened without sacrificing the A/D conversion precision, and also, the A/D converting operation with the better response characteristic can be carried out.

What is claimed is:

1. A semiconductor integrated circuit device, comprising a plurality of analog input nodes, one of which is receiving an analog signal in a predetermined sampling period;

an analog output node;

a plurality of analog switch circuits, each of which is being provided between each of the plurality of analog input nodes and the analog output node;

wherein each of the plurality of analog switch circuits includes a transfer gate and an amplifier connected in parallel;

wherein the amplifier is a differential amplifying circuit having a input node, an inverting input node and an output node, and wherein the input node is connected to the analog input node, the output node is connected to the analog output node and the inverting input node.

2. The semiconductor integrated circuit device according to claim 1, wherein said predetermined sampling period includes a first period in which the transfer gate is in a conductive state and a second period in which the amplifier is in an active state; and wherein the second period precedes the fist period.

3. The semiconductor integrated circuit device according to claim 2, wherein the second period ends before the first period starts.

4. The semiconductor integrated circuit device according to claim 2, wherein the second period is partially overlapped with the first period.

5. The semiconductor integrated circuit device according to claim 1, wherein said transfer gate includes a p-channel MOSFET and an n-channel MOSFET connected in parallel such that complimentary control signals are inputted to gates of the p-channel MOSFET and the n channel MOSFET in parallel.

6. The semiconductor integrated circuit device according to claim 1, wherein said transfer gate includes a first and a second p-channel MOSFET connected serially, and the first and second n-channel MOSFETs connected serially and the two p-channel MOSFETs and two n-channel MOSFETs are connected in parallel, and complimentary control signals are inputted to gates of the first and second p-channel MOSFETs and the first and second n-channel MOSFETs.

7. The semiconductor integrated circuit device according to claim 6, further comprising:

a first potential point (Vcc) and a second potential point (Vss) which define an operating voltage range of the semiconductor integrated circuit device, the first potential point being higher than the second potential point;

wherein a third p-channel MOSFET is connected between a serially connecting point of the first and second n-channel MOSFETs and the first potential point, and a third n-channel MOSFET is connected between a serially connecting point of the first and second p-channel MOSFETs and the second potential point;

wherein the two p-channel MOSFETs and the n-channel MOSFET become conductive state complementarily and the two n-channel MOSFETs and the p-channel MOSFET become conductive state complementarily.

8. The semiconductor integrated circuit device according to claim 6, wherein the first and second p-channel MOSFETs are formed in two different n-type well regions, and the first and second n-channel MOSFETs are formed in two different p-type well regions.

9. The semiconductor integrated circuit device according to claim 1, further comprising:

a sample-and-hold circuit connected to the analog output node; and an A/D converter connected to the sample-and-hold circuit.

10. The semiconductor integrated circuit device according to claim 9, wherein the amplifier is a voltage follower amplifying circuit.

11. A method of inputting an analog signal to a semiconductor integrated circuit device comprising:

providing the semiconductor integrated circuit having a plurality of analog input nodes, an output node, a transfer gate and an amplifier connected in parallel being respectively placed between each of the analog input node and the output node, input impedance of the amplifier being larger than impedance of the transfer gate;

selecting one of the plurality of analog input nodes;

activating the amplifier connected to the selected analog input node; and conducting the transfer gate connected to the selected analog input node after activating the amplifier.

12. The method of inputting an analog signal according to claim 11, wherein the step of conducting the transfer gate occurs after the amplifier becomes non-active.

13. The method of inputting an analog signal according to claim 11, wherein the step of conducting the transfer gate occurs while the amplifier is in an active state.

* * * * *